United States Patent [19]

Shah et al.

[11] Patent Number: 4,604,727

[45] Date of Patent: Aug. 5, 1986

[54] MEMORY WITH CONFIGURATION RAM

[75] Inventors: Ashwin H. Shah, Dallas; Pallab K. Chatterjee, Richardson; James D. Gallia; Shivaling S. Mahant-Shetti, both of Dallas, all of Tex.

[73] Assignee: Texas Instruments Incorporated, Dallas, Tex.

[21] Appl. No.: 528,303

[22] Filed: Aug. 31, 1983

[51] Int. Cl.[4] .............................................. G11C 7/00
[52] U.S. Cl. ................................... 365/189; 365/200; 365/230
[58] Field of Search ................ 365/189, 230, 233, 200

[56] References Cited

U.S. PATENT DOCUMENTS 4,390,946  6/1983  Lane ............................. 365/230 X Primary Examiner—Joseph A. Popek
Attorney, Agent, or Firm—Robert Groover, III; Douglas A. Sorensen; Melvin Sharp

[57] ABSTRACT

A memory including various selectively configurable peripherals which provide on-chip low-level control features and a configuration RAM storing bits which both provide unclocked full logic-level outputs to control the selectively configurable peripherals and can also be accessed and read out. That is, each cell in the configuration RAM has two output modes: a digital continuous output, which is provided as a continuous control signal to various peripheral circuits and a selectable analog output which is used to read the information stored in the configuration RAM.

7 Claims, 16 Drawing Figures

INPUT

| | | | | | | | | | | | | | | | |
|---|---|---|---|---|---|---|---|---|---|---|---|---|---|---|---|
| $\overline{IRST}$ | 0 | 1 | 1 | 1 | 1 | 1 | 1 | 1 | 1 | 1 | 1 | 1 | 1 | 1 | 1 |
| $\overline{CS}$ | X | X | 0 | 0 | 0 | 0 | 0 | 0 | 1 | 1 | 1 | 0 | 0 | 0 | 0 |
| CT0 | X | 0 | 0 | 0 | 0 | 0 | 1 | X | 1 | X | X | 1 | 1 | 1 | 1 |
| CT1 | X | 0 | 0 | 0 | 1 | 1 | 1 | 1 | X | 1 | X | 0 | 0 | 0 | 0 |
| CS2 | X | 0 | 1 | 1 | 1 | 1 | 1 | 0 | X | X | 1 | 0 | 1 | 1 | 1 |
| CPUPROT | X | X | X | X | 0 | 1 | X | X | X | X | X | X | X | X | X |
| DMAPROT | X | X | 0 | 1 | X | X | X | X | X | X | X | X | X | X | X |
| BA3 | X | X | X | X | X | X | X | X | X | X | X | X | 0 | 0 | 1 |
| BA4 | X | X | X | X | X | X | X | X | X | X | X | X | 0 | 1 | 0 |

OUTPUT

| | | | | | | | | | | | | | | | |
|---|---|---|---|---|---|---|---|---|---|---|---|---|---|---|---|
| MEMEN | 0 | 0 | 1 | 0 | 1 | 0 | 1 | 1 | 0 | 0 | 0 | 0 | 0 | 0 | 0 |
| WRITEN | 0 | 0 | 1 | 0 | 1 | 0 | 1 | 0 | 0 | 0 | 0 | 0 | 0 | 0 | 0 |
| PVEN | 0 | 0 | 1 | 1 | 1 | 1 | 1 | 1 | 1 | 1 | 1 | 1 | 1 | 1 | 1 |
| $\overline{PV}$ | X | X | 1 | 0 | 1 | 0 | 1 | 1 | 1 | 1 | 1 | 0 | 0 | 0 | 0 |
| $\overline{DOUT}$ | 1 | 1 | 1 | 1 | 1 | 1 | 1 | 0 | 0 | 0 | 0 | 1 | 1 | 1 | 1 |
| DMAW | 0 | 0 | 0 | 0 | 0 | 0 | 0 | 0 | 0 | 0 | 0 | 0 | 0 | 1 | 0 |
| CPUW | 0 | 0 | 0 | 0 | 0 | 0 | 0 | 0 | 0 | 0 | 0 | 0 | 1 | 0 | 0 |
| CFW | 0 | 0 | 0 | 0 | 0 | 0 | 0 | 0 | 0 | 0 | 0 | 0 | 0 | 0 | 1 |

Columns (right to left):
- I/O WRITE CONFIGURATION
- I/O WRITE DMA FILE
- I/O WRITE CPU FILE
- I/O READ
- DESELECT
- DESELECT
- DESELECT
- MEMORY READ
- WRITE OVERRIDE
- CPU WRITE FAILURE
- CPU WRITE
- DMA WRITE FAILURE
- DMA WRITE
- HALT
- RESET

MEMORY WITH CONFIGURATION RAM

BACKGROUND

1. Field of the Invention

This invention relates to static RAMs and more specifically to static RAMs including peripheral circuitry.

2. Description of the Prior Art

There are two basic types of semiconductor memories. The first type is a dynamic random access memory or dynamic RAM and stores data in cells for short periods of time. Since the storage of data in these dynamic RAM cells is short, they require refreshing. The second type of semiconductor memory is a static RAM which does not require refreshing. The disadvantage of static RAM over dynamic RAM is that static RAM occupies a larger semiconductor surface area than dynamic RAM.

The prior static RAM devices that exist perform the simple task of storing data in memory. If the memory is to be used in systems that require pipelining or parity, additional circuits must be added to perform these additional functions. An example of the existing state of the art static RAM is the Intel 2147H described in the Intel Component Data Catalog, 1982, on pp 1-44 through 1-47.

The object of the present invention is to provide a static RAM system that includes peripheral functions such as pipeline, parity and write protect capabilities.

SUMMARY OF THE INVENTION

In accordance with the present invention, a memory apparatus is provided that includes an array of storage elements connected to a plurality of addressing lines for selectively connecting a group of the storage elements to a plurality of data lines. Protect circuitry is also provided that is connected to the address lines in order to store the addresses of protected groups of the storage elements. Write circuitry is provided that is connected to the address lines and the array of storage elements for preventing the writing into the storage elements addressed by the address lines when the address is within the address of the protected groups. Control circuitry is further provided that is connected to the protect circuitry and the write circuitry for controlling the input of the protected group addresses and for enabling the write circuitry during a write operation.

In the preferred embodiment, a memory apparatus is provided that includes an array of storage elements connected to a plurality of addressing lines for selectively connecting a group of storage elements to a plurality of data lines. Protect circuitry is provided that is connected to the address lines for storing the address lines of groups of storage elements. This protect circuitry includes the capability to protect the selected groups of elements from write operations from one or more of selected write sources. In the specific embodiment, the memory apparatus is connected to a computer system that includes both write operations originated from a central processing unit and write operations originating from a direct memory access line. The protect circuitry provides discrimination between write operations from the DMA and write operations from the CPU. The protect circuitry may be programmed by the user to prohibit write operations from the CPU or the DMA or both. The memory apparatus further includes write circuitry connected to the address lines and the array of storage elements for preventing writing into the protected group of storage elements. Control circuitry that is connected to the protect circuitry and the write circuitry is provided for controlling the input of the protected group addresses and for enabling the write circuitry during a write operation. In one aspect of the preferred embodiment, the addresses input into the protect circuitry set flags corresponding to blocks of storage elements. The protect circuitry then includes two sets of registers containing the protect status of these blocks. One set of registers is for the DMA protect blocks and the second set is for the CPU protected blocks. The control circuitry further includes the override capability to ignore the protected status of the groups of storage elements. The write circuitry further includes an output that signifies when an attempt has been made to write into a protected group of storage elements. In a preferred embodiment, this output is also used to indicate the input into protect circuitry of the addresses of protected groups of storage elements.

BRIEF DESCRIPTION OF THE DRAWINGS

The novel features believed characteristic of this invention are set forth in the appended claims. The invention itself, however, as well as other features and advantages thereof will be best understood by reference to the detailed description, read in conjunction with the accompanying drawings, wherin:

FIG. 7c is a truth table for the combinational logic illustrated in FIG. 7b.

DESCRIPTION OF THE PREFERRED EMBODIMENT

Figure 1:
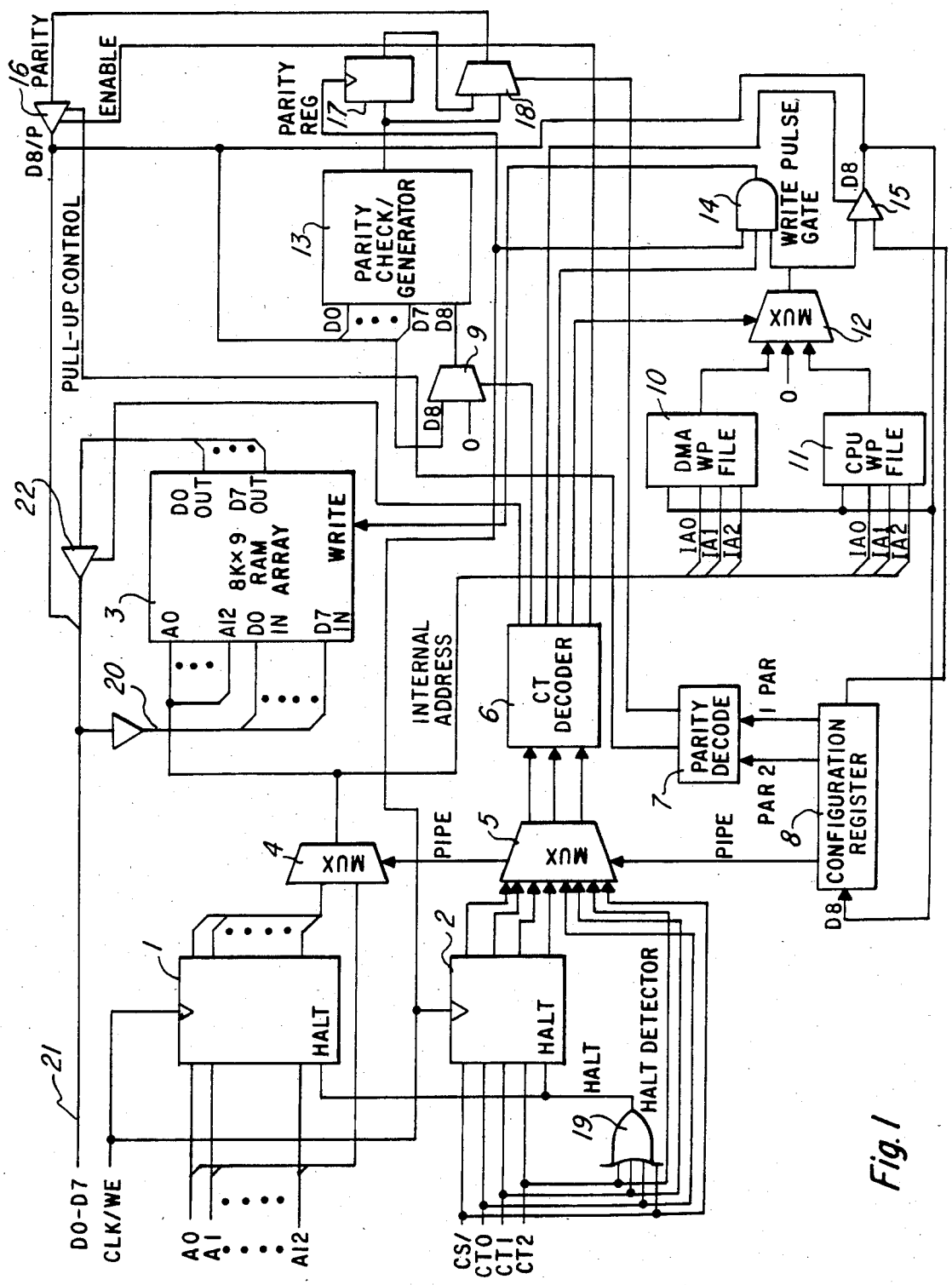
FIG. 1 is a block diagram of the memory system.

The present invention is a memory system on a single semiconductor chip rather than just a simple memory. Special features have been added in order to improve performance in order that this memory system may be used in high-speed and high-performance systems. It is felt that the integration of memory system functions onto this single chip will result in a reduction in the package number when used in computer systems. Static design is used throughout, thus eliminating the need for refresh cycles and allowing greater flexibility in system timing as well as improved reliability.

The invention is a departure from traditional memory chips in that it has complex support functions built in. This approach was felt necessary in order to meet the increased throughput requirements of modern, complex systems and further to distribute the burden of memory support throughout the system. The preferred embodiment of this invention is a static memory device organized into 8,192 (8K) words of 9 bits each. The ninth bit allows the use of parity without extra memory chips to store the parity bit. It may also be used a a ninth data bit if desired. This invention has an on-chip parity checker/generator. This allows parity to be implemented without external logic and extra chips in the system. Parity in this invention is a programmable feature, that is, it can be turned off so that the full nine bits of memory can be directly accessed if necessary. Thirteen address lines are used to address the memory array.

Another special feature of this invention is a write protection circuit. This allows an area of memory to be protected from unintentional writes that would destroy data. The memory is divided into eight blocks of 1,024 (1K) words. Each block is associated with two bits in special registers called write-protect files. One bit is used to determine if its block of memory is to be protected against write cycles initiated by a processor (CPU or Central Processing Unit) device. The other bit performs the same function with cycles initiated by Direct Memory Access (DMA) devices. The use of the two separate write-protect files bits ensures compliance with the current Mil STD-1750A for military processors. However, this feature also makes the invention a more versatile device.

Write protection may be bypased in this invention. This allows systems to use this invention that do not have the ability to control the write-protection bits. It also allows high priority tasks (such as system supervisor or operating system) to bypass or override write protection for testing or other reasons.

Another special feature of this invention is the capability to operate in a pipeline mode, where address and control setup may be overlapped with memory access and control operations. In pipeline mode, the address and control signals are sampled on the rising edge of a clock input. Although there is a slightly increased propagation delay through the address and control paths due to a pipeline register, this is outweighed by other factors. First, any delays because of address and control signal set up time are eliminated. Second, from a system viewpoint, processing of data from different memory cycles may overlap since the processor may simultaneously be reading or writing data from one memory cycle, while setting up the address and control lines for the next cycle.

Pipelining may be turned off to simplify system timing if desired. A system using the nonpipeline mode of operation cannot achieve the same throughput rates as a pipeline system, but the ability to operate in a nonpipeline mode does increase the versatility of this invention.

Pipelining, if used, is implemented through the use of a pipeline register which samples the address and control pins on every rising clock edge. Another register, the parity register, is used to implement pipelining of the parity function in some configurations.

Parity, write-protection and pipelining are all user programmable. This eliminates the need for a number of versions of this invention to be supported, or alternately more supporting hardware to be built. Feature programming is accomplished by what will be called I/O cycles (input/output) for the purposes of this description. In an I/O cycle, control registers are accessed in order to control the operation of all the special features. Control registers are accessed much the same way that the actual 8K memory is, except that the data path is only one bit wide. There are 19 one bit wide control registers in this invention currently in use.

Three of the control registers form the configuration register. It is used to determine which special features are active. Parity, pipeline timing and write protection may be programmed by changing bits in this register. The function of the parity output buffer is also programmable. The other 16 control registers are for write protect which are used to protect 1K blocks of words from overwrites. Their function has already been explained. Their contents are ignored if write protection is overriden, but remain unaltered for future use. The write protect registers are used during DMA and CPU protected memory write cycles to gate the memory write pulses. In the event that a write pulse is blocked, a specific output goes to low indicate the write failure.

It is also possible to use this invention in a system that cannot support the I/O cycles which are necessary to control the special features. These modes of opertions with partial or no cycle control are referred to as "dumb" modes. For example, after a reset, this invention can function as a simple 3K×9 memory in a non-pipeline mode without write protection or parity. These modes are later described in more detail.

The invention is controlled by 6 control lines. There are 3 CT (Cycle Type) lines which define what operation is to be performed, a chip select (CS/) to activate the chip, a reset (RST/) to return the invention to a known state, and the clock-write enable (CLK/WE) to synchronize the memory in the pipeline mode or to provide a write-enable phase in the non-pipeline mode. The CT lines identify I/O or memory cycles, read or write, and provide DMA or CPU controlled accesses. The function of the CT lines will be described in more detail.

A pin (RST/) on this chip is dedicated to resetting the memory system to a known state. Although the contents of the memory array are unaltered, the pipeline register is cleared, and the configuration and write protection registers are set to a known state. This is the only reliable way of bringing up and initializing the memory system from a cold start.

DETAILED DESCRIPTION OF THE MEMORY ARCHITECTURE

A detailed block diagram of the memory system is shown in FIG. 1. Architecturally, this memory system is a large memory array surrounded by support circuitry for parity, write protection and pipeline operations.

The memory array 3 stores 8,196 words of 9 bits each. As shown in FIG. 1, 13 address bit lines, IA0 through IA12 are used to address the array 3, and form the internal address bus. The memory address bus, A0 through A12, may be either fed directly (through only a buffer) to the internal address bus, or it may be sampled periodically using the pipeline register 1. The actual path depends upon the state of the pipeline control bit in the configuration register 8. If this bit is high, then the pipeline register is used. The memory array uses static storage cells and therefore does not require refreshing.

Data is transferred to and from the memory array 3 over the internal data bus 20 formed from bits ID0 to ID8. Data is transferred to and from the SRAM over lines D0 through D7 and D8/P which form the memory data bus 21. Lines D0 to D7 are connected to the memory internal data bus through buffers. Data bit D8/P is programmable, and may be used as an ordinary bit, or as a parity bit. If parity is active, D8/P is connected to the parity checker/generator 13 instead of ID8. In a memory write cycle, D0 through D7 are used to generate a parity bit which is fed to ID8. In a memory read cycle, 9 bits from ID0 through ID8 are fed to the parity checker, which generates a parity bit on D8/P.

The invention may be throught of as a memory with a semi-intelligent memory controller that is capable of executing a number of instructions. A different type of memory cycle is performed depending upon the instruction. An instruction is received on the CT (Cycle Type) lines (CS, CT0 through CT2) at the beginning of every cycle. These three lines CT0, CT19 and CT2 and with CS/ and RST/ are decoded to determine the operation to be performed. The CT decoder 2 is responsible for deriving the internal control signals from the CT lines. Table 1 shows the different types of cycles supported, and their codes. Conventional memories have all control signals in unencoded form available at their input pins. In order to retain all of the special features and remain in a 32 contact package configuration, it is necessary to encode some of the control signals into a denser form. Since memory chips are traditionally used in relatively large numbers, it is advantageous to reduce the number of pins in the package.

A pipeline register 1 may be switched into the address lines A0-A12. A second pipeline register 2 may be switched into the control bit paths CT0-CT2 and CS/. These pipeline registers, 1 and 2, are rising edge triggered off of the CLK/WE signal which is the system clock. The pipeline registers, 1 and 2, are switched in and out of the control paths depending upon the pipeline bit and the configuration register 8. There is no pipeline register in the data path. A special piepline register called the parity register 17 is used in some of the parity modes. It affects only line D8/P.

This memory system supports a Halt Cycle, mainly for debugging and fault tolerant computing purposes. In the pipeline mode, a halt means that the pipeline register is not reloaded on the rising edge of CLK/WE. Instead, the previous contents are retained and the last cycle is repeated until something other than a halt cycle is detected. Note that since there is no pipeline register in the data path, whatever is on the data bus is written into the memory system during a halt if the last cycle was a write cycle. Reset cycles are treated as deselect cycles if a halt cycle occurs immediately after a reset. A halt cycle in the nonpipeline mode is treated as a deselect cycle, since the memory system has no record of what the last cycle was.

It is important to note that a halt cycle must be decoded prior to the pipeline register since it must prevent that register from being reloaded. FIG. 1 shows that the halt detection circuitry 19 is testing the CT lines before entering the CT decoder 6.

Note that CS/ is a (don't-care) in the halt cycle. Care must be exercised by a system designer using this memory system to prevent accidental halt cycles that may be caused by releasing the CT lines to an unknown state whenever the bus is not needed.

The parity checker/generator 13 and the parity register 17 are used to implement the parity function in this memory system. Parity is active if either of the parity bits in the configuration register 8 and 1. If the parity is active, the parity of the stored data word is present at the D8/P pin on a memory read cycle. If parity is active, D8/P functions as a parity output signal. It is inactive on a memory write cycle; ID8 is driven by the parity checker/generator 13 in that case, and represents parity generated over bits D0-D7. In a memory read cycle, a nine bit parity check is performed over bits ID0-ID8, and the result is sent out of the memory system over D8/P. The D8/P pin requires a special buffer 16. If parity is deactivated, it functions as a normal push-pull buffer, since these buffers are used on D0-D7.

TABLE 1

| | | | | | Control Decode |
|---|---|---|---|---|---|
| | | | | | SRAM |
| | CONTROL SIGNALS | | | | 10 |
| CS/ | RST/ | CT0 | CT1 | CT2 | FUNCTION |
| — | 0 | — | — | — | RESET - ALL BUFFERS TRISTATED PARITY OFF, WRITE PROTECT BITS REQUIRES THREE RISING EDGES OF CLOCK TO TURN OFF RESET. |
| — | 1 | 0 | 0 | 0 | HALT CYCLE. PIPELINE REGISTER RECIRCULATES OR CHIP DESELECT IF NONPIPELINED. HALT AFTER RESET IS TREATED AS A DESELECT. |
| 0 | 1 | 0 | 0 | 1 | DMA MEMORY WRITE CYCLE |
| 0 | 1 | — | 1 | 0 | MEMORY READ CYCLE |
| 0 | 1 | 0 | 1 | 1 | CPU MEMORY WRITE CYCLE |
| 0 | 1 | 1 | 0 | 0 | I/O READ CYCLE |
| 0 | 1 | 1 | 0 | 1 | I/O WRITE CYCLE |
| 0 | 1 | 1 | 1 | 1 | MEMORY WRITE/PROTECT OVERRIDE |
| 1 | 1 | — | — | — | NO NEW OPERATION ADDED TO PIPE (DESELECT) |

In the parity mode, it sometimes becomes desirable to tie the D8/P pins on many memory chips together to form a single parity error signal. When word length in excess of 8 bits is used, such as 16 bits, two or more memory system chips will be on at once to form the longer word. If one chip experiences a parity error, and another does not, there would be a conflict of signals. To resolve this, the D8/P buffer 16 may be programmed to deactive the pullup device. Certain configurations of the two parity control bits in the configuration register 8 will turn off the pullup device 16 on D8/P (see Table 2).

Parity checking can slow down system operation because checking cannot begin until data has been accessed and is stable. This extra delay may be eliminated if an extra stage of pipelining is used in the parity path. This extra stage complicates system timing somewhat in the parity for a read cycle does not become valid until the next cycle, if this extra register is used, however, there are no delays caused by a parity checking. The use of this parity register 17 is programmable. It may be inserted in the path by setting a pipeline parity bit in the configuration register 8 (see Table 2).

The effect of this parity register 17 is to delay the parity from the read cycle until the next cycle. This mode of parity is referred to as next cycle parity; likewise same cycle parity occurrs when the parity register is bypassed.

If a parity error is detected, the active pulldown device 16 drops D8/P to an active low. Since there is an active pulldown device, the high to low transistion should occur at a high speed, comparable to a push-pull device. If the active pull up device is deactivated, pull up is done with an external resistor, which requires much more time than an active pull-up device. Because the data from the memory array has stabilized, it is possible for the parity circuit to generate a false parity error, and pull the D8/P line low, thus requiring a long recovery time before parity is valid.

In the pipeline mode, with next cycle parity active, the parity register 17 shall prevent glitches from occurring on D8/P, thus obtaining the maximum possible speed from the memory system while using parity. This is not true in other modes of operation and the user must be aware of possible glitches to allow time for a passive pull up device to settle the parity line.

The configuration register 8 is a 3 bit control register used to determine which of these signals are used. Table 2 shows the bit assignment in the configuration file. The configuration register 8 contains a pipeline bit and two parity control bits. The pipeline registers 1 and 2 are activated using the pipeline bit. Whenever this is high, the pipeline registers 1 and 2 are in the address and control bit paths, respectively. There are 2 parity control bits. If either one is high, then parity is active. As shown in Table 2 they also control an extra stage of pipelining in the parity output and the output buffer 16 for D8/P, the parity output. Data transfer to and from the configuration register 8 is done with I/O cycles.

TABLE 2-2

| Configuration Register Function Table | | | |
|---|---|---|---|
| PIPE | PAR1 | PAR2 | FUNCTION |
| 0 | — | — | NonPipeline Operation |
| 1 | — | — | Pipeline Operation |
| — | 0 | 0 | No parity, Push-Pull output on D8/P |
| — | 0 | 1 | Same cycle parity, Push-Pull output on D8/P. |
| 0 | — | 1 | Same cycle parity, Push-pull device on D8/P |
| 0 | 1 | 0 | Same cycle parity, Pull down only on D8/P. |
| 1 | 1 | 0 | Next Cycle parity, Pull down only on D8/P. |
| 1 | 1 | 1 | Next cycle parity, Push-pull device on D8/P. |

Write protection is implemented using a write pulse gated circuit and two 8-bit registers 10 and 11. These registers, 10 and 11, the write circuit protect files, are addressed one bit at a time and provide protection against CPU and DMA initiated overwrites. The file to be used is determined by the decoding the CT lines. In the memory write with protection override cycle, the write protection files are ignored and the write pulse is always passed to the memory array 3.

The write protection circuit has a dedicated output, PV/, which is used for two functions. First, in a memory write cycle, this signal is used to indicate an unsuccessful write has been attempted into a protected area. In this case, the PV/ signal will go low and the write will not occur. The second use of this signal is in the I/O cycle. It wll go low during any I/O cycle as an echo that a functional memory system is in the I/O mode. This is an aid in implementing the Mil-STD-1750A specification which requires that an unimplemented memory fault be flagged when an empty area of memory or I/O space is addressed, although it does not do the entire function.

The PV/ signal will become valid shortly after the control lines are stable in the nonpipeline mode or after the rising edge of CLK/WE in the pipeline mode. It is not necessary to wait for CLK/WE to go low, which ordinarily starts the write pulse.

The write protecton bits are accessed directly by I/O cycles. They are also read in memory cycles according to the 1K block in memory defined by A0–A2 and by the cycle type to determine if write pulse addresses to the memory array are to be passed or blocked. The register file 10 or 11 to be used is determined by decoding CT0–CT2 to determine if a CPU or DMA cycle is occurring. A special write protection override cycle may be signaled by the CT bus. In this case the "dummy" file is addressed, which is not really a file at all, but some logic that always reads as 0 (not protected) to the write pulse gating circuit 12. A dummy file is used as a means of describing this operation since it occupies a vacant space in the I/O address space and may be used for other functions.

Table 3 shows how the configuration file bits are addressed in the protection files 10 and 11. Certain locations in the I/O address space are reserved for future additions to the memory system and others are reserved for testing purposes. I/O cycles use only D0 to actually transfer data to and from the configuration register 8 and write protection registers 10 and 11. In an I/O write cycle, all data inputs are ignored, except for D0. In an I/O ready cycle, only D0 will have valid data from the bit being read. Other data bits will not contain valid data in an I/O read cycle. They will be at valid logic levels for 1's and 0's, although the actual value is undefined.

This is necessary when the memory system is used in a system where data from the memory system is latched on the system clock edge into a register. There is a small but finite chance that if the input to this register is at a level that is neither a valid 1 nor 0, than it will enter a metastable state and will remain there for several clock cycles. Such states are rarely encountered but are extremely difficult to find, and can cause considerable difficulty.

TABLE 3

| A4 | A3 | A2 | A1 | A0 | Function of bit *1 |
|---|---|---|---|---|---|
| 0 | 0 | 0 | 0 | 0 | CPU PROTECT K0 |
| 0 | 0 | 0 | 0 | 1 | CPU PROTECT K1 |
| 0 | 0 | 0 | 1 | 0 | CPU PROTECT K2 |
| 0 | 0 | 0 | 1 | 1 | CPU PROTECT K3 |
| 0 | 0 | 1 | 0 | 0 | CPU PROTECT K4 |
| 0 | 0 | 1 | 0 | 1 | CPU PROTECT K5 |
| 0 | 0 | 1 | 1 | 0 | CPU PROTECT K6 |
| 0 | 0 | 1 | 1 | 1 | CPU PROTECT K7 |
| 0 | 1 | 0 | 0 | 0 | DMA PROTECT K0 |
| 0 | 1 | 0 | 0 | 1 | DMA PROTECT K1 |
| 0 | 1 | 0 | 1 | 0 | DMA PROTECT K2 |
| 0 | 1 | 0 | 1 | 1 | DMA PROTECT K3 |
| 0 | 1 | 1 | 0 | 0 | DMA PROTECT K4 |
| 0 | 1 | 1 | 0 | 1 | DMA PROTECT K5 |
| 0 | 1 | 1 | 1 | 0 | DMA PROTECT K6 |
| 0 | 1 | 1 | 1 | 1 | DMA PROTECT K7 |
| 1 | 0 | 0 | 0 | 0 | PIPELINE ENABLE |
| 1 | 0 | 0 | 0 | 1 | PARITY BIT 1 |
| 1 | 0 | 0 | 1 | 0 | PARITY BIT 2 |
| 1 | 0 | 0 | 1 | 1 | RESERVED *2 |
| 1 | 0 | 1 | 0 | 0 | RESERVED *2 |
| 1 | 0 | 1 | 0 | 1 | RESERVED *2 |
| 1 | 0 | 1 | 1 | 0 | RESERVED *2 |
| 1 | 0 | 1 | 1 | 1 | RESERVED *2 |
| 1 | 1 | 0 | 0 | 0 | RESERVED FOR TESTING *3 |
| 1 | 1 | 0 | 0 | 1 | RESERVED FOR TESTING *3 |
| 1 | 1 | 0 | 1 | 0 | RESERVED FOR TESTING *3 |
| 1 | 1 | 0 | 1 | 1 | RESERVED FOR TESTING *3 |
| 1 | 1 | 1 | 0 | 0 | RESERVED *2 |
| 1 | 1 | 1 | 0 | 1 | RESERVED *2 |
| 1 | 1 | 1 | 1 | 0 | RESERVED *2 |
| 1 | 1 | 1 | 1 | 1 | RESERVED *2 |

Figure 2:
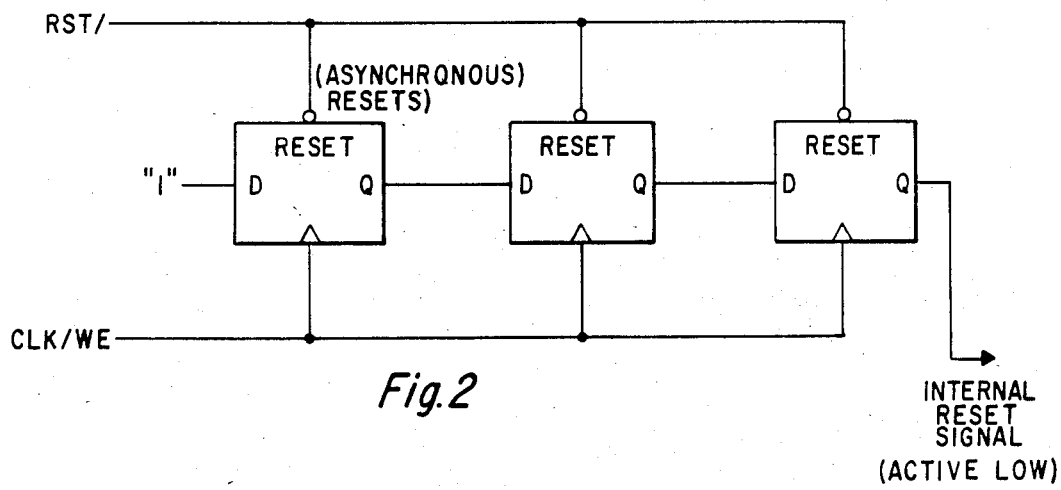
FIG. 2 is a schematic diagram of the reset circuitry.

*1 - Active high function
*2 - This Operation not defined at this time
*3 - For in-house use only As shown in Table 1, the reset function overrides all other control signals. It is the only signal that operates asynchronously in either pipeline or nonpipeline mode. Reset immediately causes all buffers to enter a high impedance state. FIG. 2 shows the logic used in the reset functon. Entering the reset state is an asynchronous process that starts as soon as a logic 0 is detected on the reset pin, however, leaving the reset state is a synchronous process; three rising edges of the CLK/WE pins are required to leave this state. In a nonpipelined system, this requires three write pulses. Referring to FIG. 2, the implementation of the synchronous reset is through 3 D-type flip-flops as shown.

Table 4 shows the reset states of all the configuration bits in the configuration register 8. The main purpose of requiring 3 rising edges of CLK/WE to leave the reset state is to allow synchronization of the memory system with other components in the system without having to use an asynchronous reset signal. Logic internal to the memory system will synchronize it to CLK/WE before leaving the reset state. A 3 edge delay allows the processor or other system controller to become active before the memory devices do. This also allows the memory system internal registers to be synchronously set to a known state.

TABLE 4

| | Reset States of Control Bits | |
|---|---|---|
| BIT | RESET STATE | FUNCTION |
| CPUWP0-7 | 0 (not protect.) | CPU protection bits |
| DMAWP0-7 | 0 (not protect.) | DMA protection bits |
| PIPE | 0 (NonPipeline) | Pipeline control |
| PAR0 | 0 (No Parity) | Parity Control 0 |
| PAR1 | 0 (No Parity) | Parity Control 1 |

The memory system may be also operated in several "dumb" modes. A dumb mode may be defined as an operation in a system that cannot generate all of the possible cycle type instructions. There are two levels of "dumbness" that are supported by the present invention. In the first level, the processor can perform I/O cycles to modify the configuration and write protection bits. This is achieved by hardwiring CT0 high. In this first dumb mode, the memory system never executes a HALT cycle and write protection is always ignored. CT1 is used to qualify between I/O (0) and memory (1) cycles.

In a second dumb mode, CT1 is also tied high. This mode allows only memory reads and memory writes with protection override. This state requires that the system processor source only a write/read line which is connected to CT2. The memory system is selected for use by the CS/ input. This is necessary for all reads and writes to both array 3 and the control bits.

It is important that since the memory system may be operated in pipeline mode, the chip selection process actually occurs on the rising edge of each clock, when pipelined. Once sampled, it may change states and the rest of the cycle will proceed. The same is also true if pipeline parity is used. In that case CS/ is sampled two cycles before. According to Table 1, the CS/ signal is a "DON'T CARE" whenever a HALT cycle is initiated in the pipeline mode. This means that any cycle could be repeated, even if the chip was not selected on the current cycle. This should be taken into careful consideration by the system designer, not only when deliberately using a HALT cycle, but also to prevent accidental HALT cycles caused by invalid signals on the CT lines. However, in the nonpipeline mode, there is no HALT cycle. The code for a HALT will cause a deselect.

The RST/ pin is used to trigger a reset. The reset causes an immediate (asynchronous) disabling of all output buffers. It also sets an internal counter that will not allow exiting from the reset state until after the reset line is high and 3 rising edges are detected on CLK/WE line (see FIG. 2). All internal control registers are set to known states. This need not be done asynchronously since the output buffers are immediately disabled, and at least 3 clocks are available before leaving the reset state. This is an active low input. The RST/ line overrides all other inputs, even CS/, no matter what the state the memory system is.

Memory and control registers are addressed by the address lines A0-A12. A0 is considered the most significant bit of the address. The only "significance" of this is that the 1K write protection boundaries are chosen by A0, A1 and A2. Addressing of the control bits during I/O cycles uses A0-A4. Selection of either memory or I/O cycles is not determined by the address lines, rather it is controlled by the CT lines.

Lines D0-D7 are bidirectional data lines over which data is transferred to and from the memory system. D0 is also used to transfer data to and from the control registers 8, 10 and 11 during I/O cycles. The direction of data transfer is controlled by decoding the CT lines.

Line D8/P is a multifunctional line which may operate as a simple data line, or as a parity error output line as was previously discussed. A special buffer 16 with a deactivated pull up device (programmed) allows parity error outputs from several active memory systems that are tied together and wide words to eliminate extra system logic.

The PV/ line is used to signal that either an I/O cycle is taking place or a write failure has occurred due to a protection violation by either the CPU or DMA devices as indicated by the cycle type. CLK/WE is a multifunctional line. In the pipeline mode it is the system clock and controls the loading of instructions and data into the pipleline registers as well as controlling the write pulses to memory and control bits. In the nonpipeline mode, it functions as the write pulse only. It should be noted that the design of the memory system allows this line to be tied to the system clock even in the nonpipeline mode, and uses the CT lines to determine the actual operation. No write to either memory or control bits can occur unless the CT lines call for a write. All output buffers, such as 21, are "push-pull" types with both active pull up and pull down devices, with the exception of buffer 16 for D8/P which may have the pull up device deactivated. In this case an external pull up resistor is required. All inputs and outputs to the memory system are designed to TTL capable with respect to the valid 0 and 1 voltage ranges.

TIMING

The memory system may operate in either pipelined or nonpipeline mode. The different between the timing of these modes is substantially difference. Read and write cycles may be performed in either mode to either memory or control register (I/O) locations. There are four classes of cycles, although there are more cycle types. These cycles are:
1. Memory Read Cycle
2. Memory Write Cycle
3. I/O Read Cycle
4. I/O Write Cycle.

A read cycle is any cycle where data is sourced by the memory system. A write cycle is any cycle where the data is sourced externally and deposited in the memory system. A memory cycle is any cycle where the memory array 3 is accessed. An I/O cycle is any cycle where the control or write protect bits are accessed. For example, a cycle where data is deposited into a write protect bit is an I/O cycle; it is also a write cycle, therefore an I/O write cycle is performed.

Figure 3:
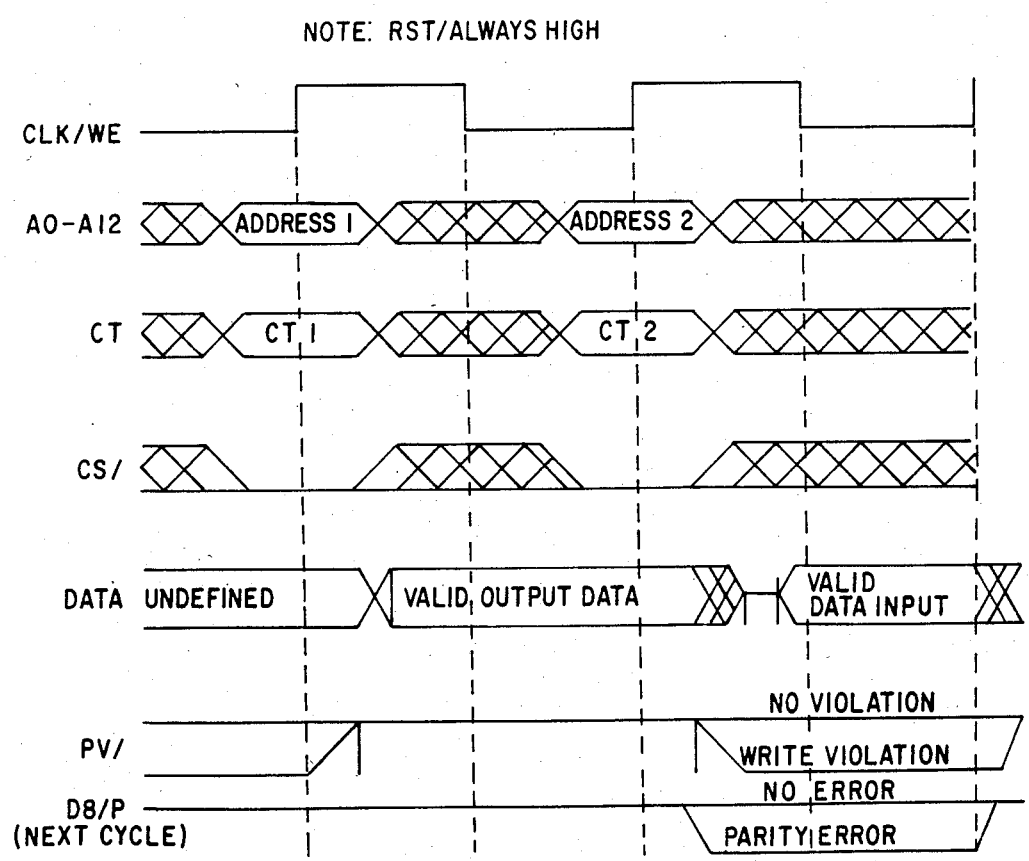
FIG. 3 is a timing diagram for the pipeline memory cycle.

FIG. 3 shows a timing diagram which illustrates both the memory read and write cycles in the pipeline mode. In this example, a memory read cycle is followed by a memory write cycle. The PV/ output indicates whether or not the write was successful. If the PV/ line goes low, then the output was unsuccessful (unsuccessful because the write protect bit for the selected memory area was set to 1). The pipeline mode makes full use of the memory system registers that latch the address and control lines in order to relieve the address and control setup time penalty. The data lines are not latched and data must appear at the right time as shown by the diagram in FIG. 3. Parity may be latched internally, depending upon the parity control bits in the configuration register 8 (FIG. 1). This is why the timing diagram (FIG. 3) shows a parity output cycle delayed from this data. This may be somewhat inconvenient, but it is considered less important than slowing the entire cycle down by enough time for data to propagate through the parity checker 13 (FIG. 1). In any case, it may be programmed off, so that a slower cycle with parity in the same cycle may be performed, as previously discussed.

Figure 4:
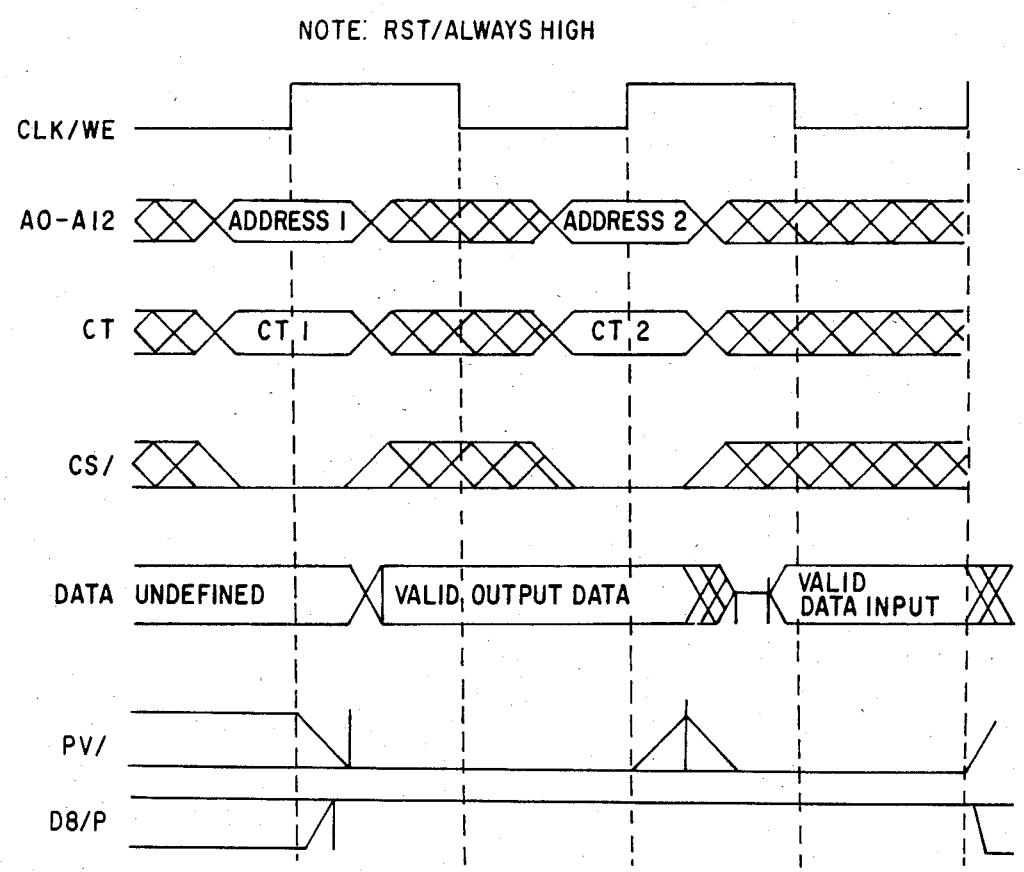
FIG. 4 is a timing diagram for the pipeline I/O cycle.

FIG. 4 shows a timing diagram for accessing the control and write protect bits. There are several differences between this type of cycle and the memory cycle. First of all, data is transferred over D0 only, although valid voltage levels are maintained on other data outputs to prevent the possibility of a mestable state in processors using this memory system. Another difference is that the PV/ output is always low. This is used as a confirmation signal that an I/O cycle is taking place. The final difference is that the parity line is always inactive (high or high impedance, depending upon programming) for the parity output that corresponds to the I/O cycle.

Figure 5:
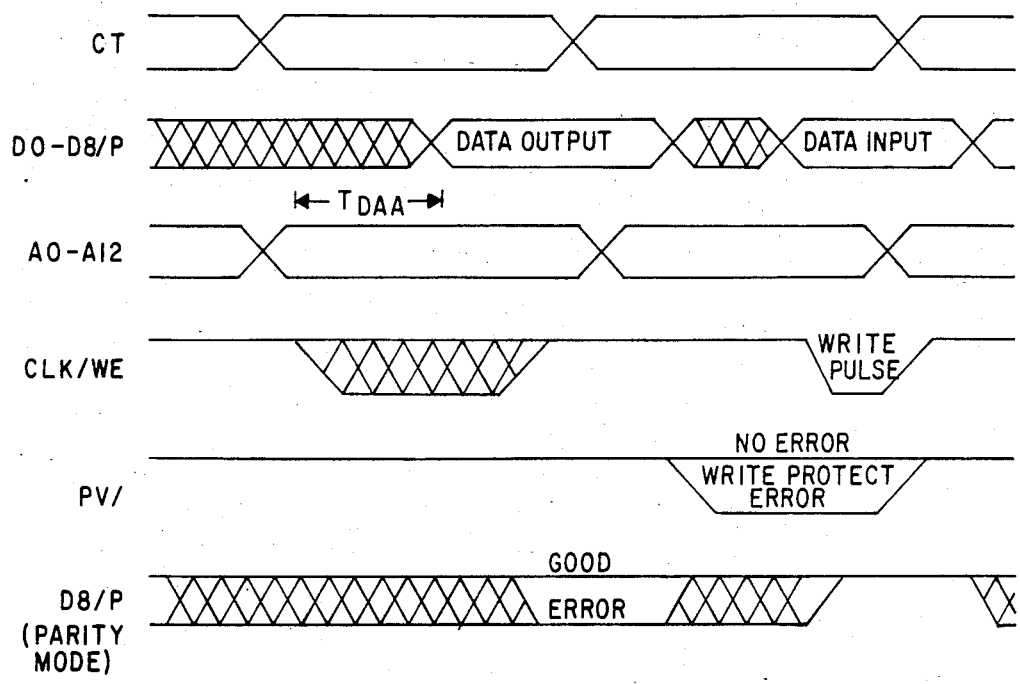
FIG. 5 is a timing diagram for the nonpipeline memory cycle.

FIG. 5 shows the timing diagram for a nonpipeline memory read and write cycle. This is substantially different from the same cycles in the pipeline mode. A nonpipeline cycle is usually substantially slower than the corresponding cycle. In the nonpipeline mode, the system clock may still be used as a write enable signal. This requires that no operation be performed if CLK/WE is low and CT lines indicate a ready cycle. It is also possible to use CS/ to control the write cycle, since writes cannot occur when the chip is not selected.

Figure 6:
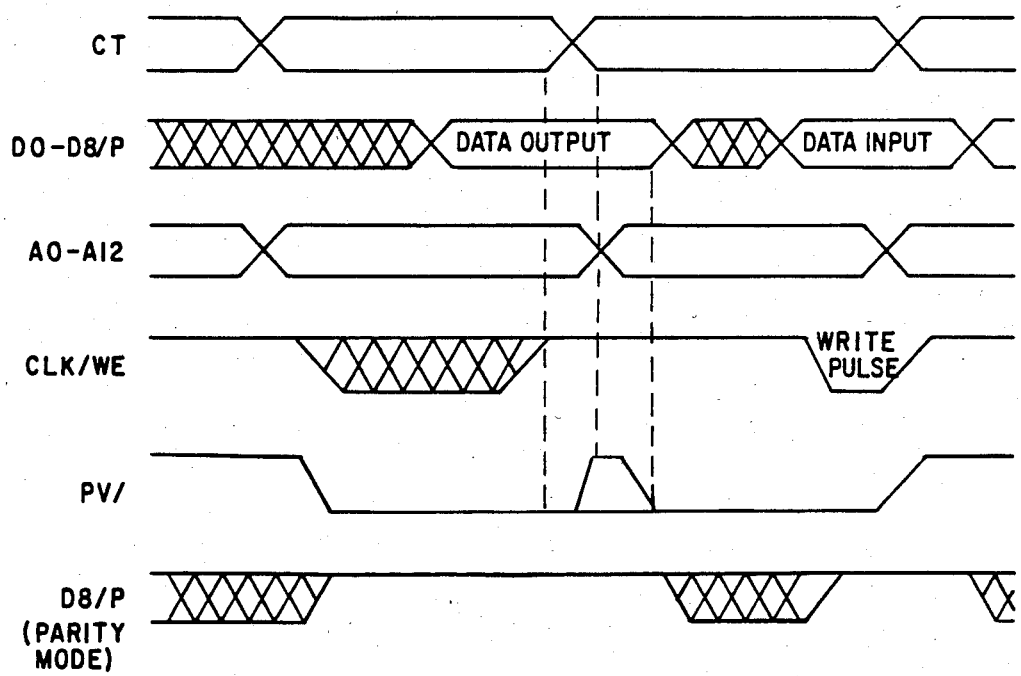
FIG. 6 is a timing diagram for the nonpipeline I/O cycle.

FIG. 6 illustrates the nonpipelines I/O cycle. The nonpipeline I/O cycles are similar in form to the nonpipeline memory cycles, and similar in function to the pipeline I/O cycles. PV/ always goes low, and parity always stays high during the I/O cycle. PV/ goes low as an echo of the I/O cycle, and parity stays high since parity is not used in the I/O cycle.

The peripheral functions are controlled in this memory system through the use of the chip select (CS/) line together with the CLK/WE line and the CT0 through CT2 lines. The CT decoder 6 in FIG. 1 decodes the control lines in order to control the peripheral functions in this memory system.

Figure 7A:
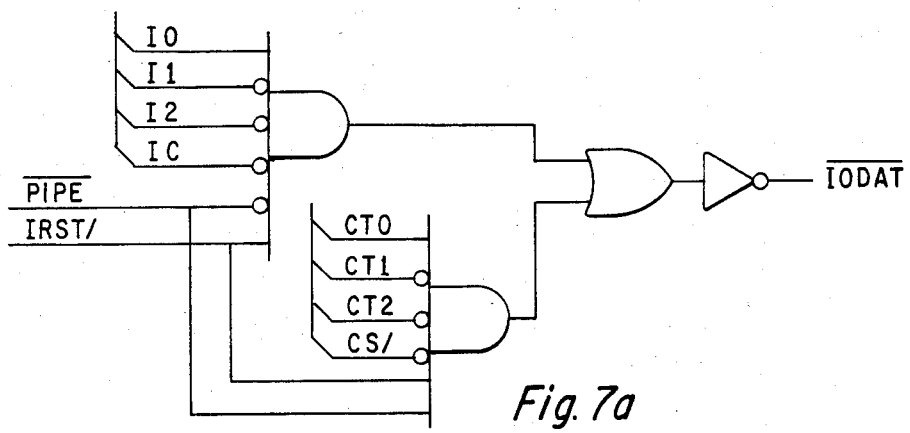
FIG. 7a is a schematic of a portion of the control decode circuitry.

FIG. 7a illustrates on the logic functions performed by the CT decoder 6. The lines I0 through I2 and Ic are internally buffered lines representing CT0 through CT2 and CS/. Pipe/ is the internal designation of the pipeline mode. IRST/ is the internal designation of the reset signal which is the output of the circuitry illustrated in FIG. 2. CT0 through CT2 and CS/ are the received respective signals. The logic in FIG. 7a produces the I/O DAT/ signal which determines an internal I/O cycle.

Figure 7B:
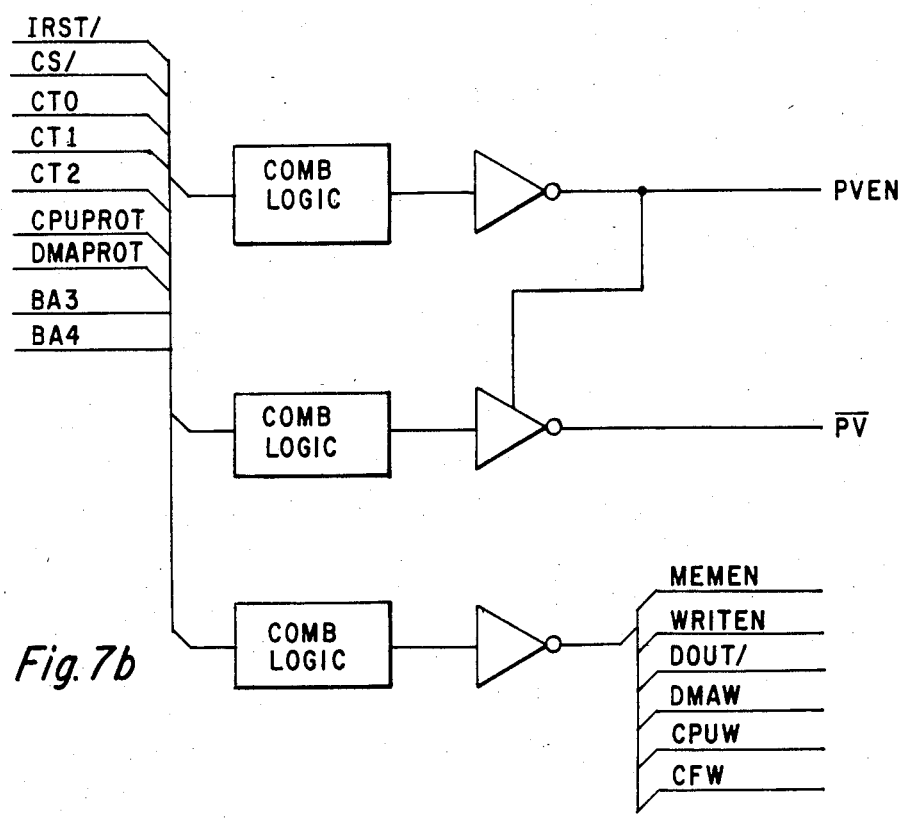
FIG. 7b is a schematic of the remaining control decode circuitry.

FIG. 7b is a top level diagram of the remainder of the logic in the CT decoder 6 in FIG. 1. This logic includes inputs CPUPROT and DMAPROT which are the CPU protection signal and DMA protection signal designating that the data that is being addressed is protected in reference to the DMA write protect file or the CPU write protect file. BA3 and BA4 are the respective address bits for the memory access. The logic in FIG. 7b outputs a PVEN and a PV/ signal. PV/ designates a prevent violation. PVEN is an enable signal to enable the tristate buffer to produce the PV/ signal as shown. The remaining outputs of the circuitry are MEMEN for memory enable, WRITEN for write enable, DOUT/ to designate that memory data is being placed on the external bus, DMAW for DMA write, CPUW for CPU write and CPW for a write into the configuration register.

FIG. 7c illustrates the truth table for the combinational logic shown in FIG. 7b. Note that each line of the output is mapped to a specific event. The lines mapped "D SELECT" designate a "DON'T CARE" situation for this particular portion of the memory system since CS/ is 1, meaning that the chip has not been selected. The CPU write failure and DMA write failure results designate the failure to input data into the memory because of intervention of the DMA and CPU write protection circuitry.

MEMORY CELL

The memory cell in the SRAM ARRAY 3 in FIG. 1 is disclosed in the patent application entitled, "Low Power SRAM Cell" by Pallab K. Chatterjee and Ashwin M. Shah, Ser. No. 357,944, filed Mar. 15, 1982, herein incorporated by reference.

DESCRIPTION OF THE PREFERRED EMBODIMENTS

The presently preferred embodiment of the invention will now be described in further detail.

Figure 8:
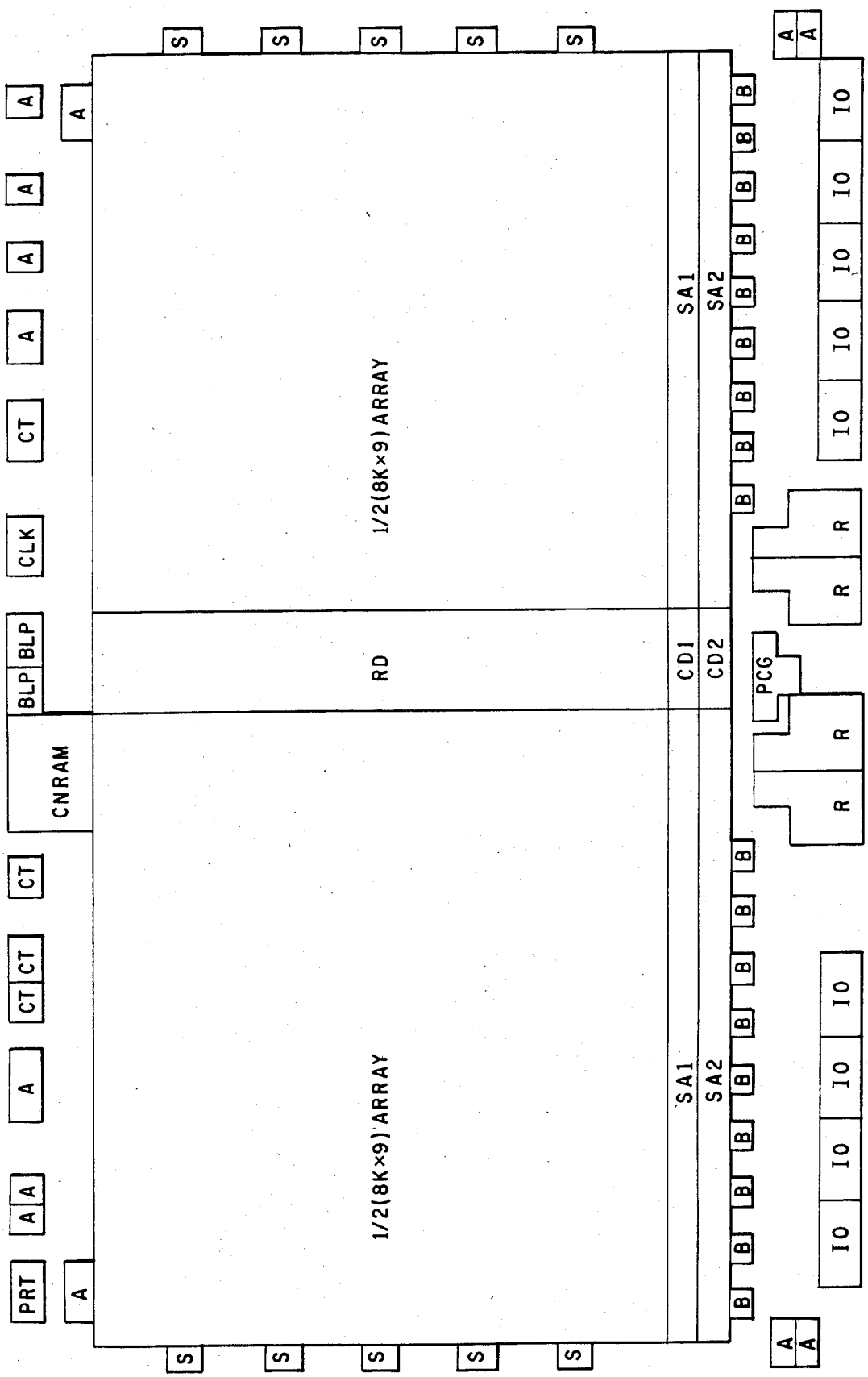
FIG. 8 shows the general physical layout of the memory of the presently preferred embodiment, incorporating selectable features of write protect, parity check, parity-output wired-or, and address pipelining.

The present invention is preferrably embodied in an 8K by 9 memory, of which the layout is shown in FIG. 8. The memory is split into two 4K by 9 half-arrays, each containing outputs at each of 9 bit positions. Each half-array preferably contains two redundant columns, each of which can be substituted for any defective column in half-array. One bit of the column address selects the right or left half-array, and the other four bits of column address are separately addressed in two stages: Column decoder CD1 decodes the least significant bits to provide four address lines. Each set of four primary sense amplifiers (corresponding to four columns) is connected to one secondary sense amplifier through a multiplex switch controlled by the four lines from decoder CD1. Decoder CD2 decodes the most significant bits, to select the appropriate secondary sense amplifier SA2 for each bit position. The redundancy blocks R each permit substitution of one of the two redundant columns for any defective column in the corresponding half-array, depending on the status of blown fuses. The parity generation, and check logic (PCG) generates a ninth parity bit from a 8-bit input, and also performs a parity check on each 9-bit byte as read out from the array. The configuration RAM circuit CNRAM stores write protect information for 8 memory blocks (16 bits), and also stores bits indicating the selectable enablement of the parity check, address pipelining, and optional active pull up of the parity violation output signals. (If active pull up is disabled, then multiple chips can be wire-ORed together, but external pull up resistors are required.)

In the presently preferred embodiment, configuration RAM CNRAM is a single short column of memory cells. In the presently preferred embodiment, 23 memory cells are provided, but only 19 of these are actually used to control functions on the chip.

Figure 11:
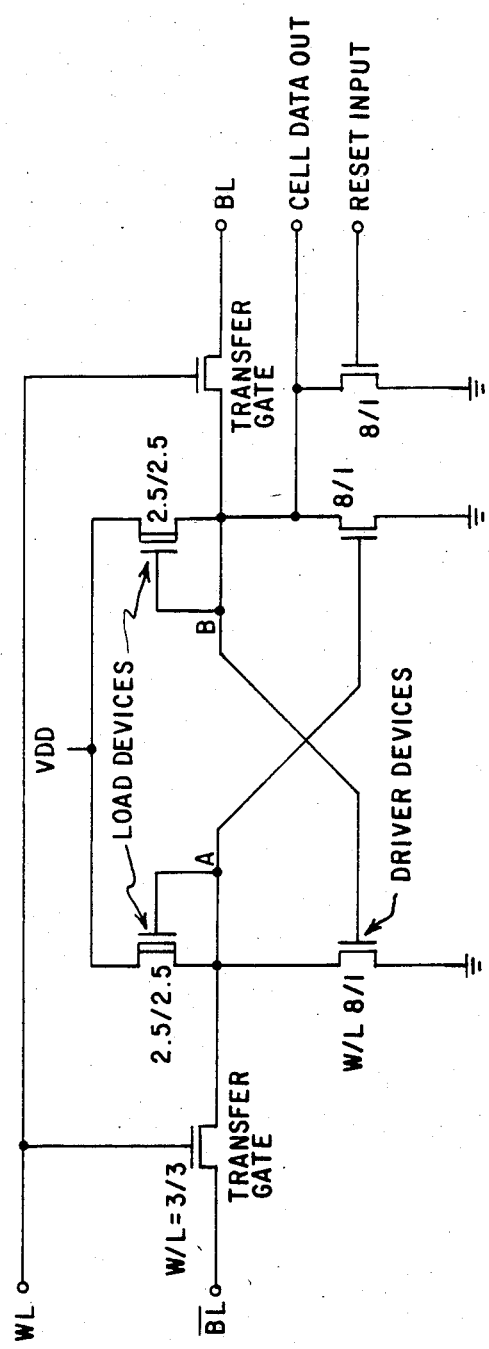
FIG. 11 shows a circuit diagram of one of the cells in the configuration RAM of the presently preferred embodiment, which provides a unipolar continuous data output.
Figure 12:
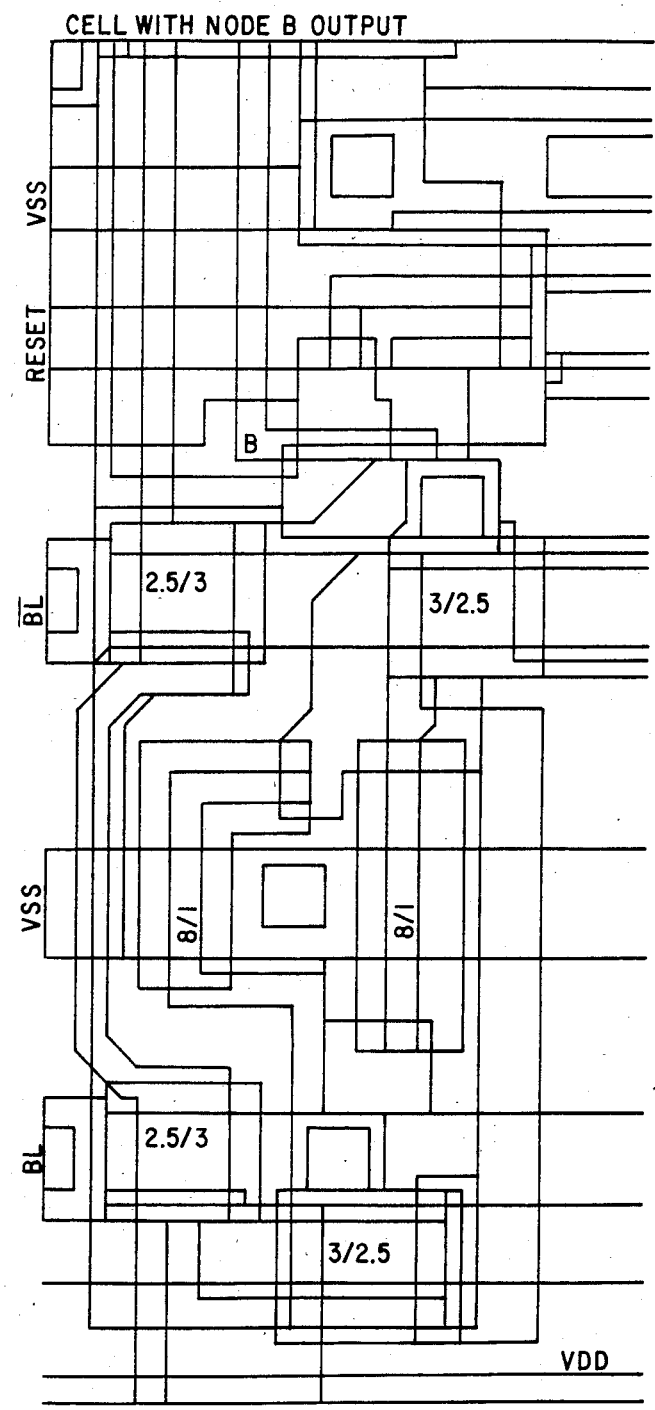
FIG. 12 shows a sample layout of the memory cell of FIG. 11.
Figure 13:
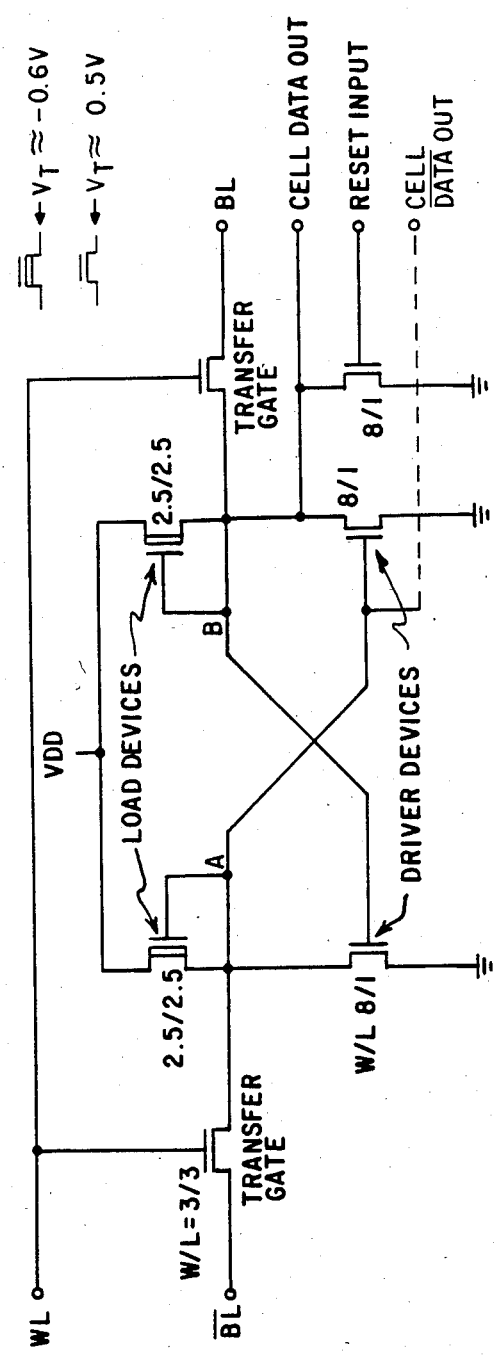
FIG. 13 shows another type of memory cell configuration RAM of the presently perferred embodiment, wherein complementary continuous-read outputs are provided.
Figure 14:
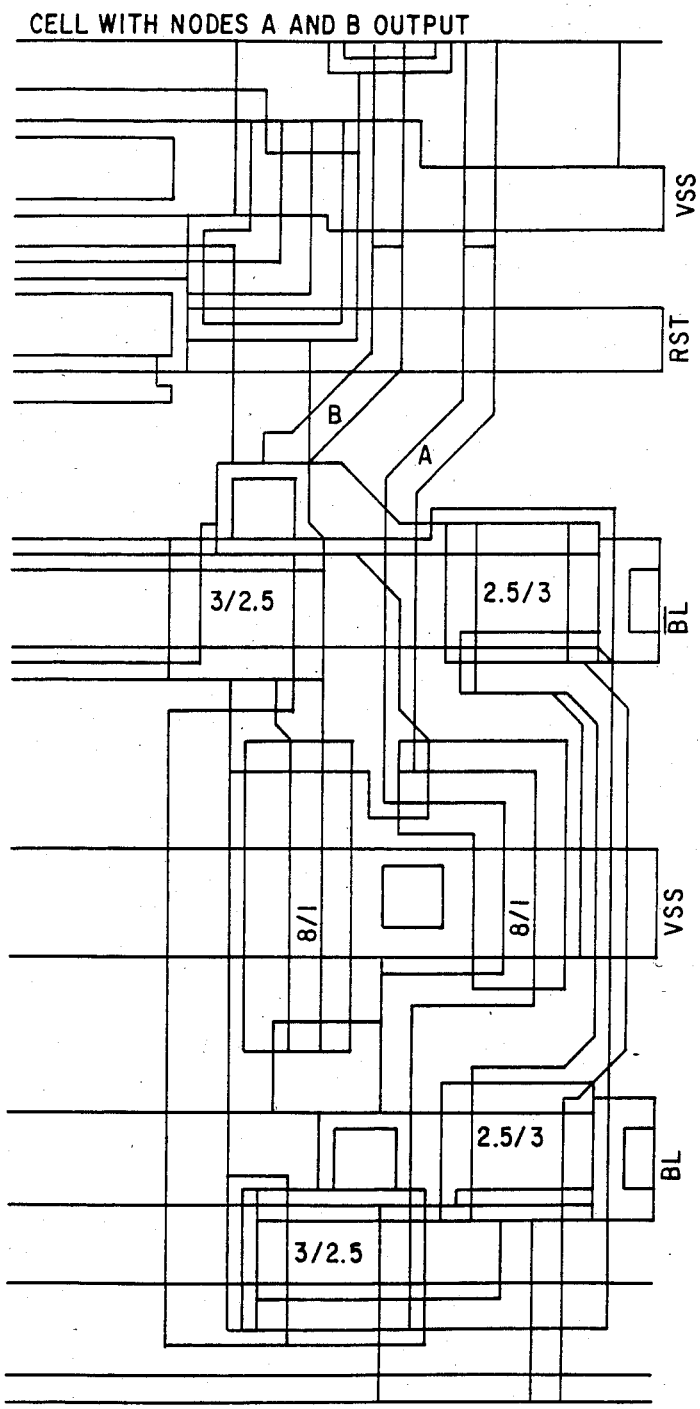
FIG. 14 shows a sample mask layout of the memory cell of FIG. 13.

Each memory cell in the configuration RAM is preferably as shown in FIG. 11 or 13. That is, each memory cell preferably has both a direct digital output and also an analog output gated by the word line WL. A pair of bit lines BL and $\overline{BL}$ are provided for gated access to each of the cells in the configuration ram, and the lines BL and $\overline{BL}$ provide complementary inputs to sense amplifier shown in FIG. 10. Each of the bit lines BL and $\overline{BL}$ has its own load device, so that, when one of the memory cells accessed by line WL is read out, the voltages on BL and $\overline{BL}$ do not see the full digital swing, but merely are changed by an amount which is reduced by the impedance of the cell access transistors (which limit the current flowing to the bit line loads). This means that, although full digital signals (i.e. high level equal to supply voltage) are seen on the data out lines, the bit lines see only a small voltage swing, of, e.g., several hundred millivolts. This is highly advantageous.

The limited voltage swing on the bit lines in the configuration RAM is desirable because this configuration RAM must be able to function as a random access memory. That is, when the chip is queried to determine the status of its various status options, successive read cycles within the configuration RAM are very likely. If full digital signals were provided from one of the memory cells onto the bit lines during these special configuration RAM read cycles, read disturb would be quite possible. That is, if another cell were accessed while full digital signals still existed on the bit lines, the signals on the bit lines could be written back into the second cell accessed inadvertently.

Thus, the configuration RAM used in the present invention must meet somewhat unusual requirements, in that it is necessary to provide a constant output as a control signal and also to be read into and written out of preferably using conventional high-speed SRAM timing, without read disturb. The use of a column of cells each having two kinds of outputs according to the present invention advantageously solves this problem.

Figure 9A:
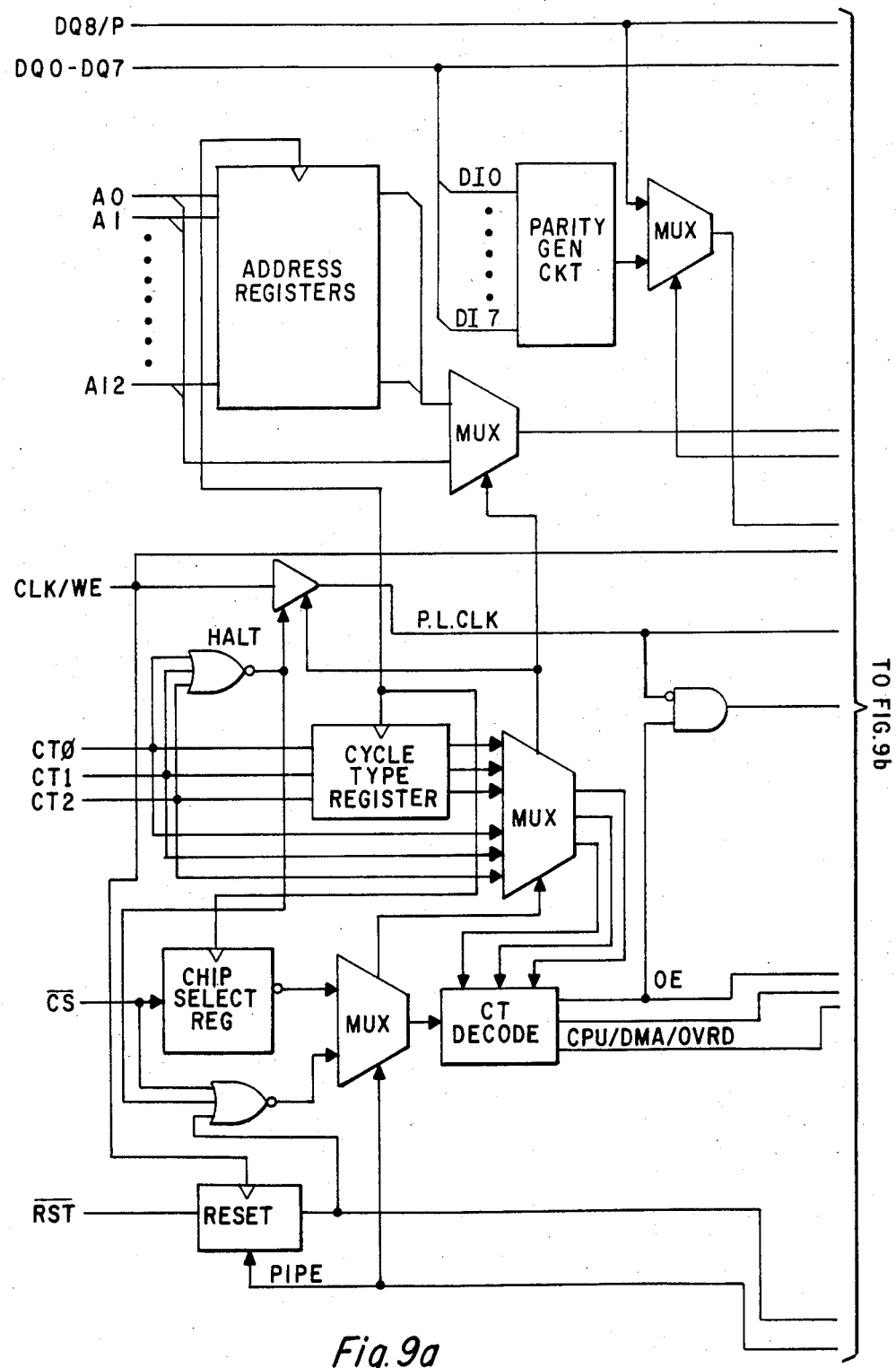
FIG. 9 shows a block diagram of the inter-connection of the configuration RAM of the present invention with the various peripheral circuits in the memory of the presently perferred enbodiment.
Figure 9B:
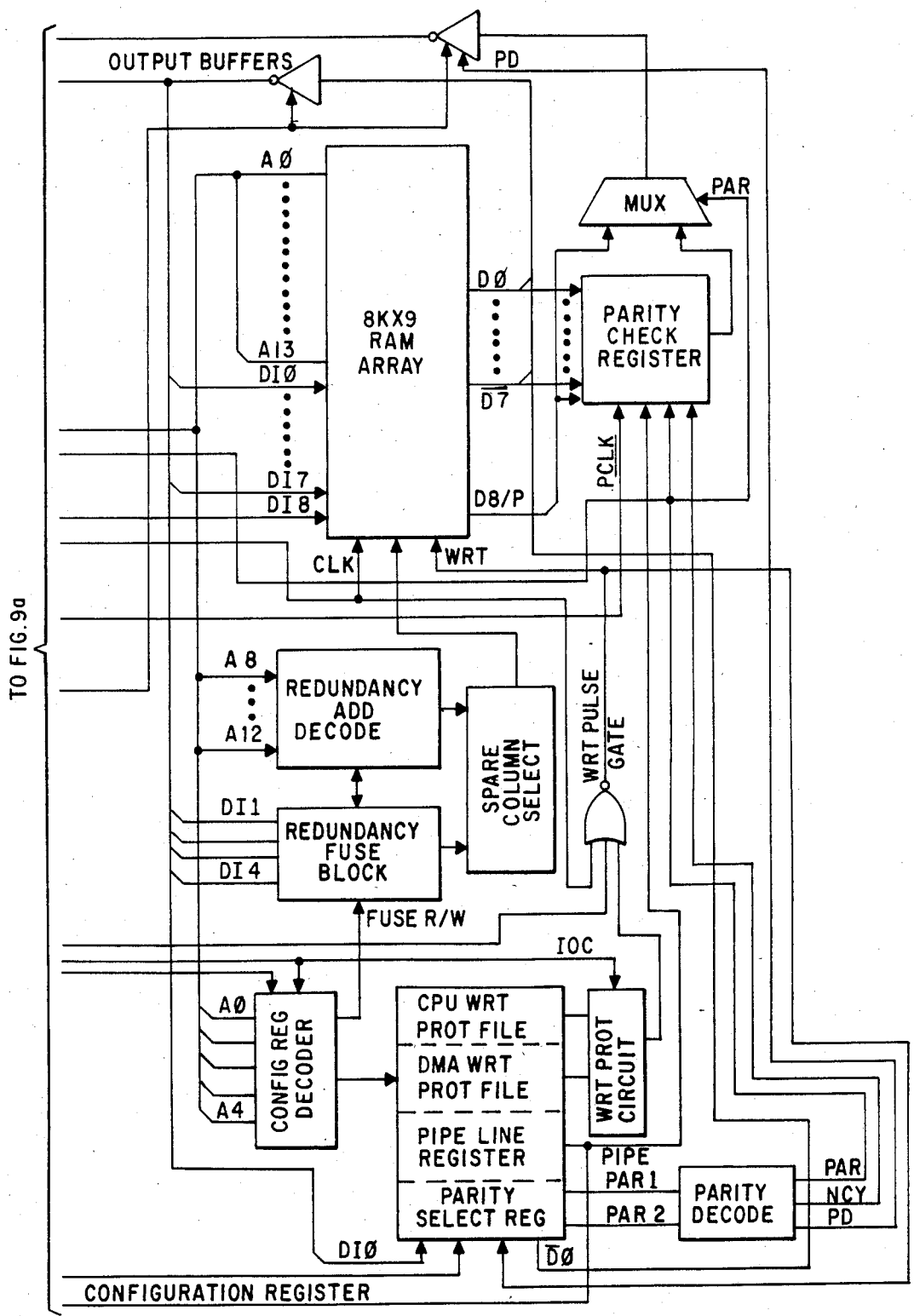
Figure 10A:
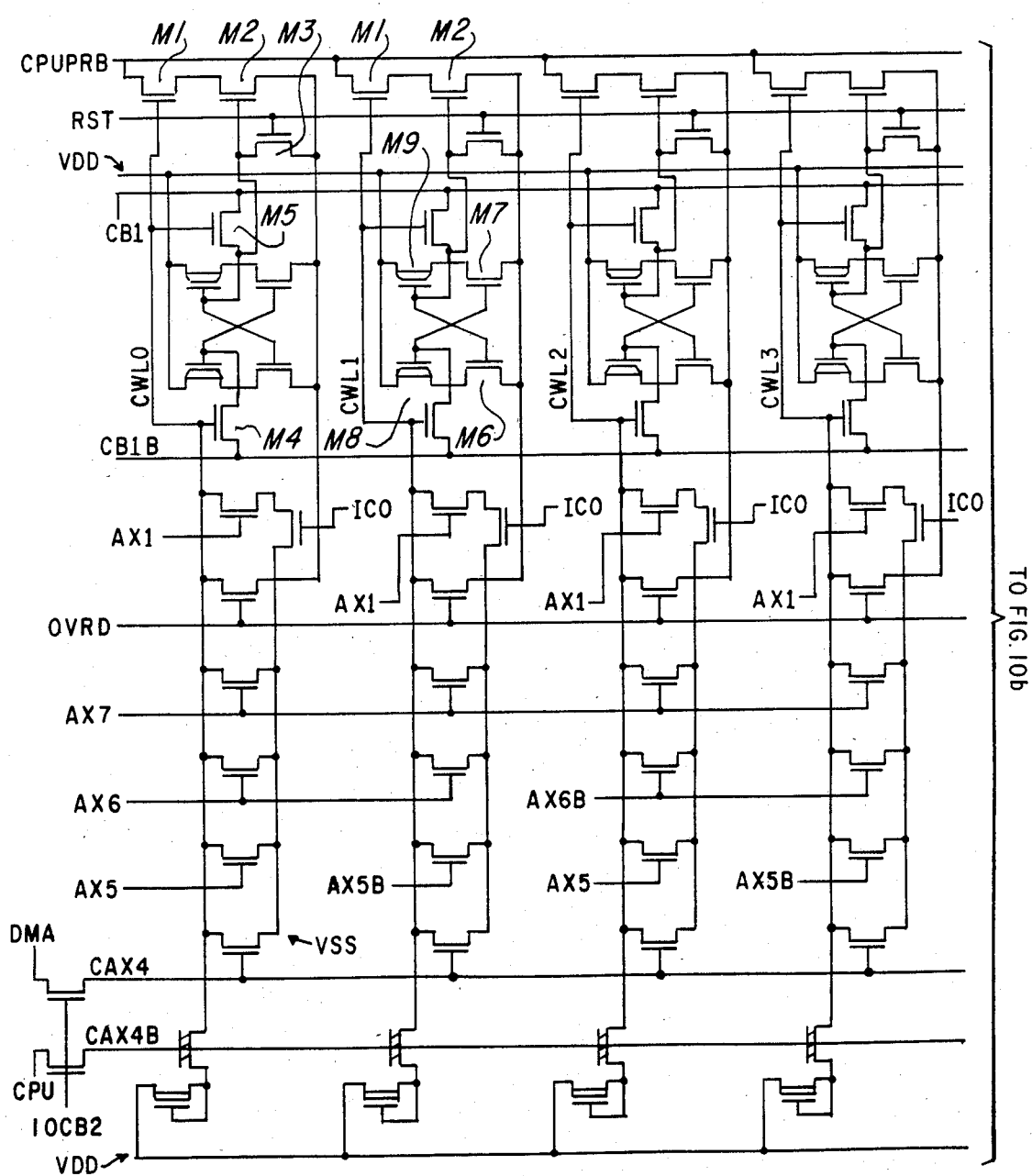
FIG. 10 shows a circuit diagram of the presently preferred embodiment of the configuration RAM of the present invention.
Figure 10B:
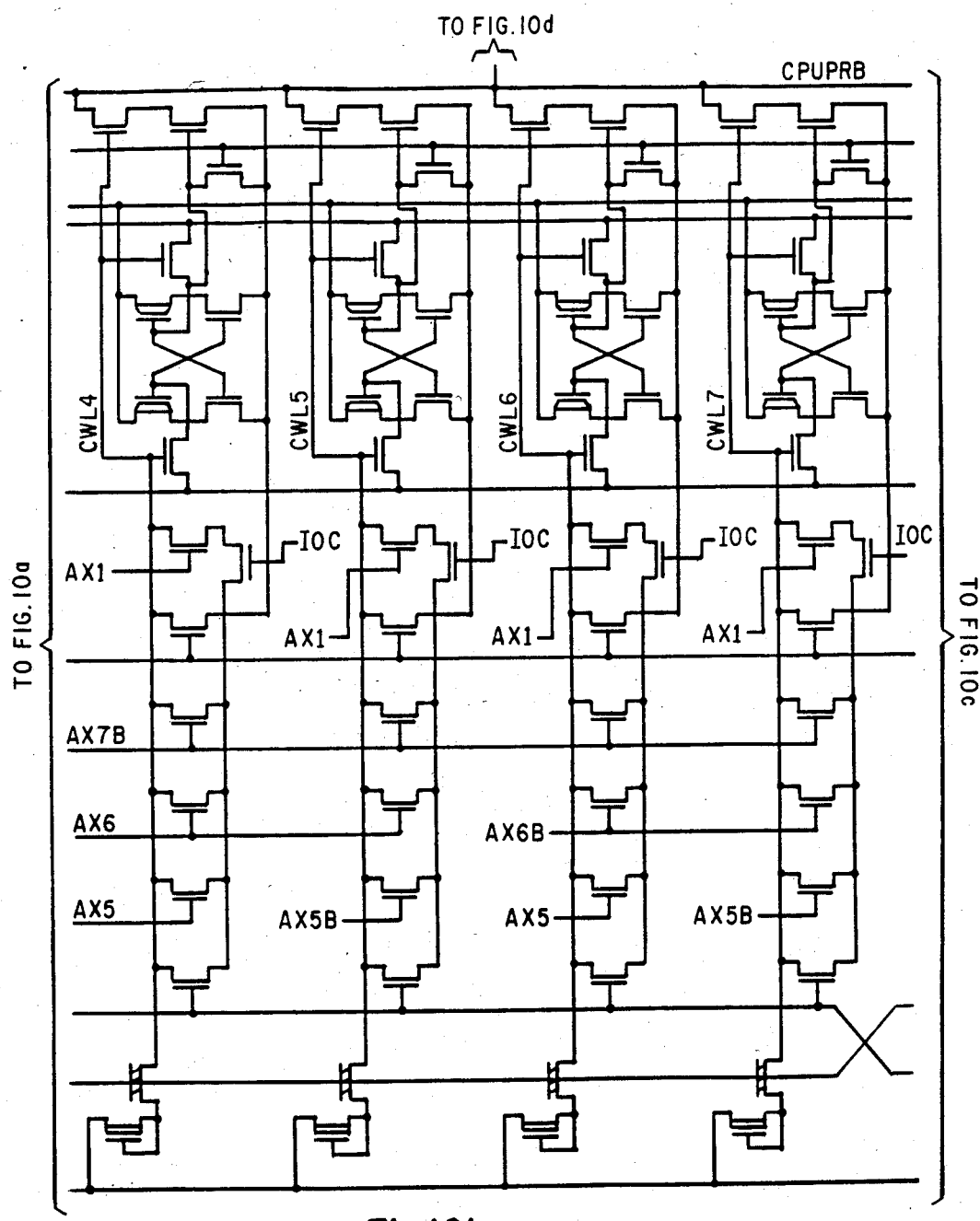
Figure 10C:
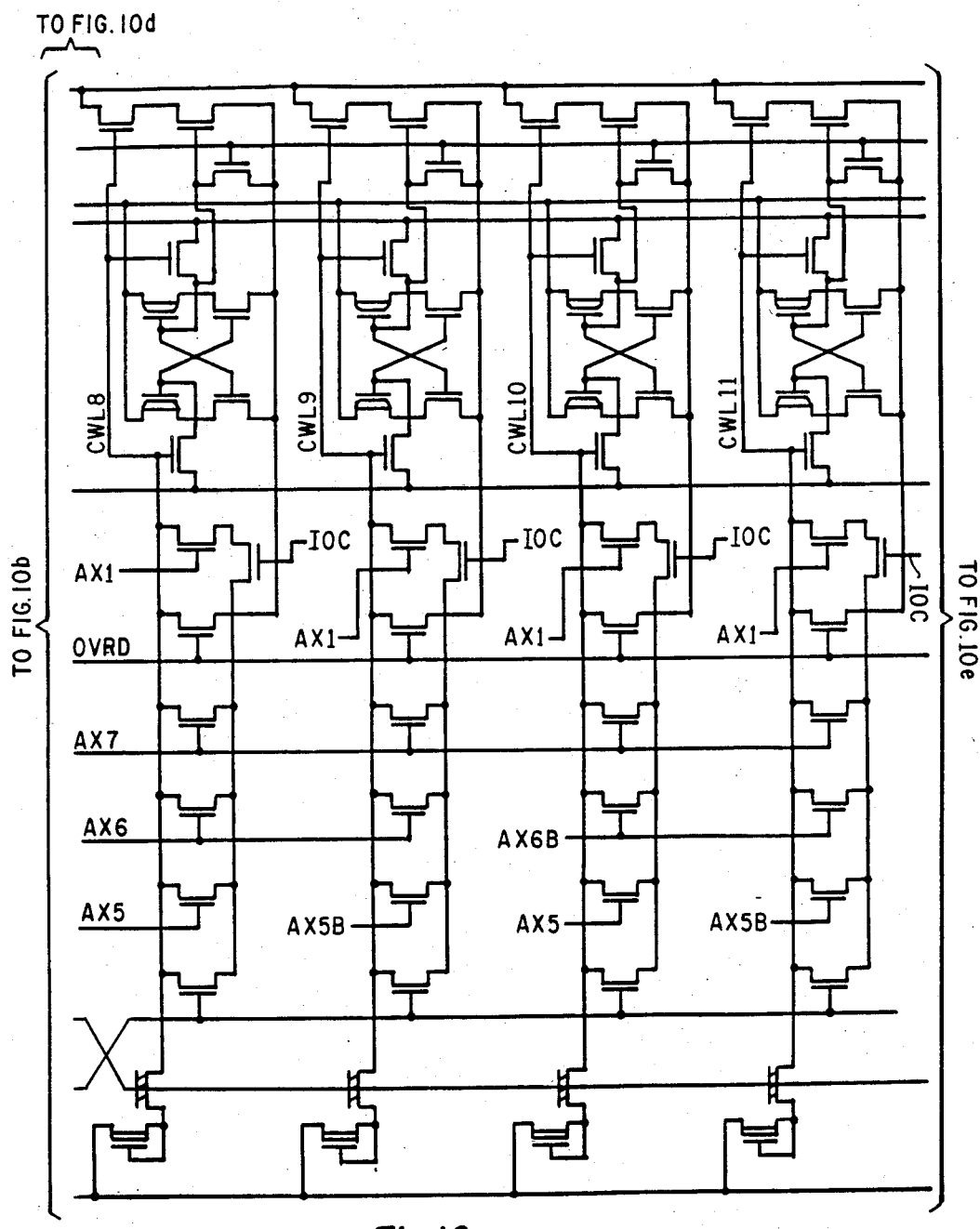
Figure 10D:
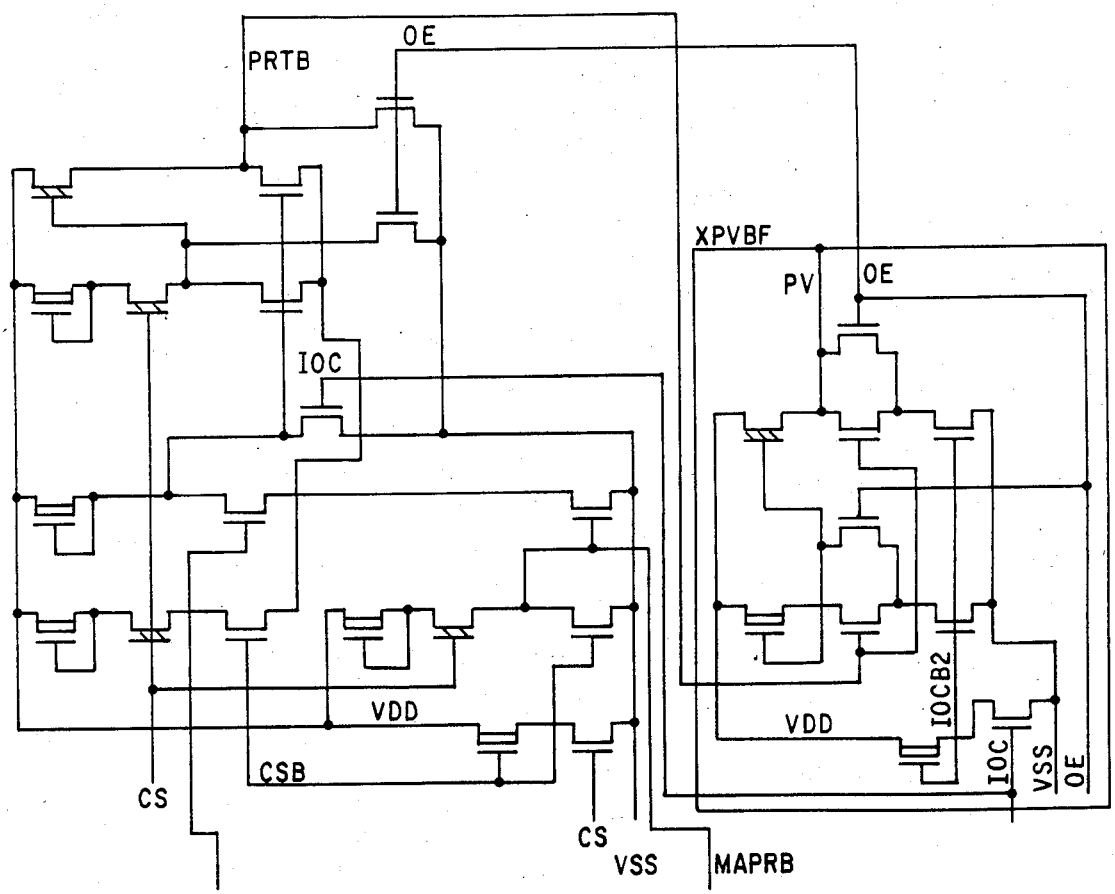
Figure 10E:
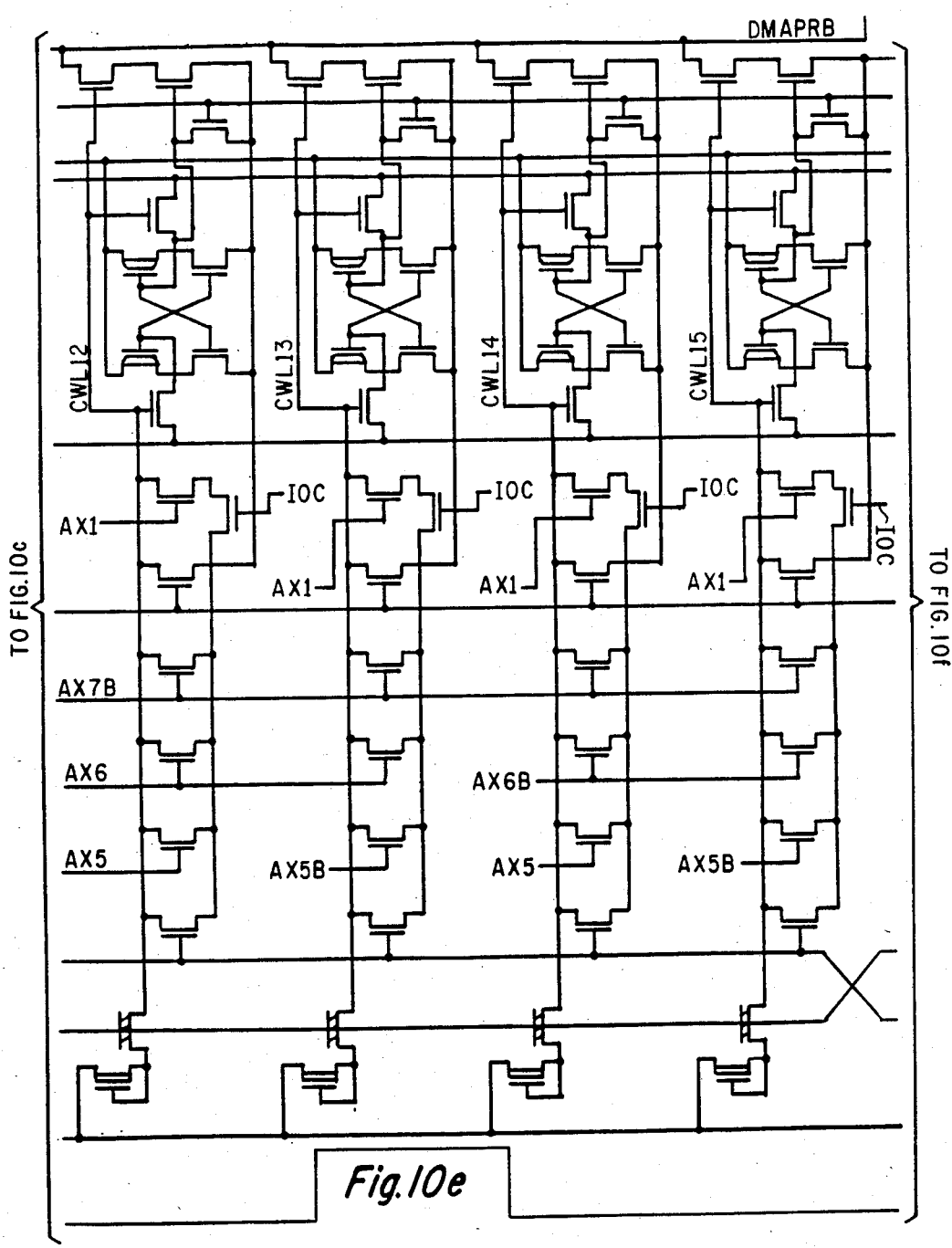
Figure 10F:
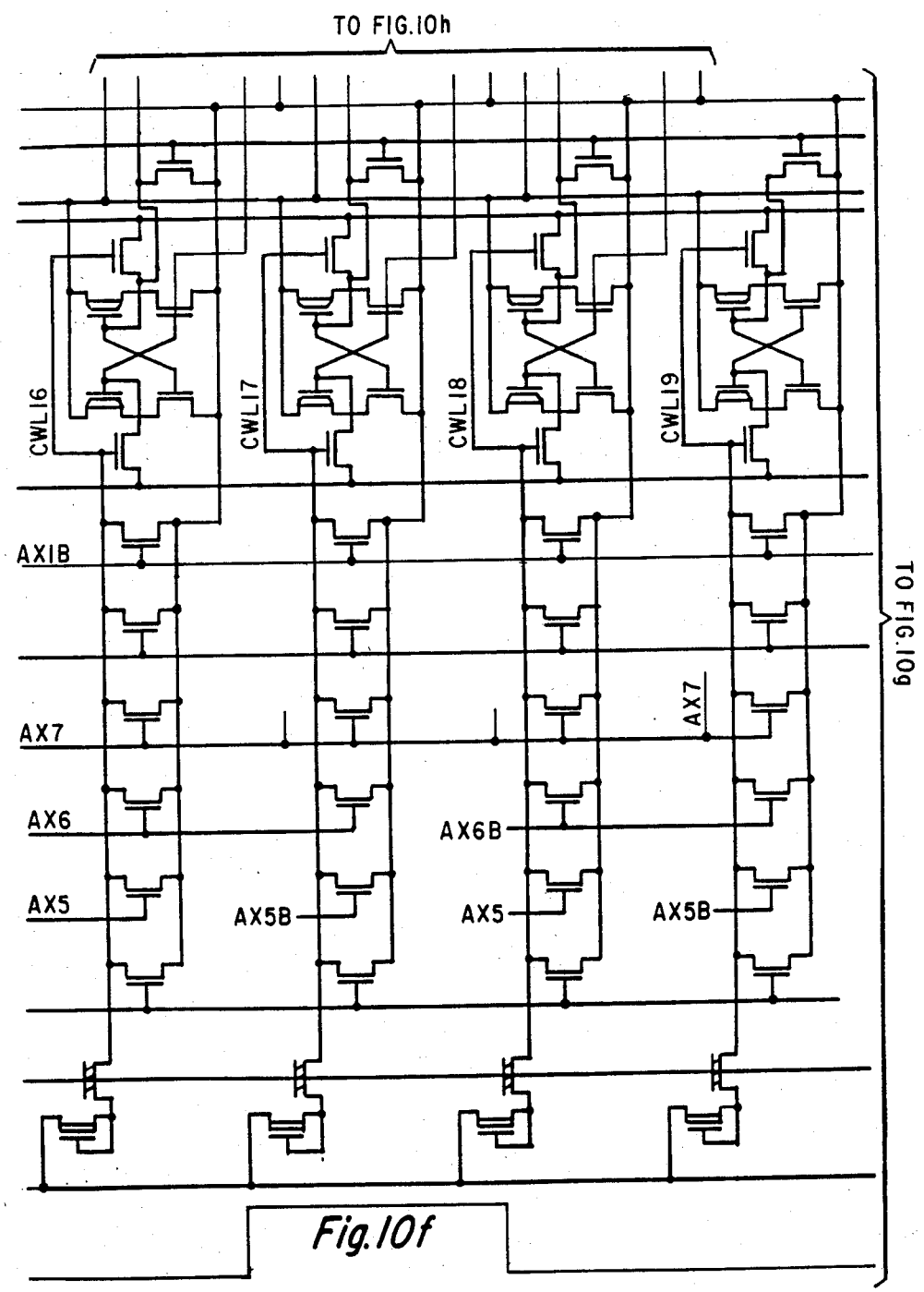
Figure 10G:
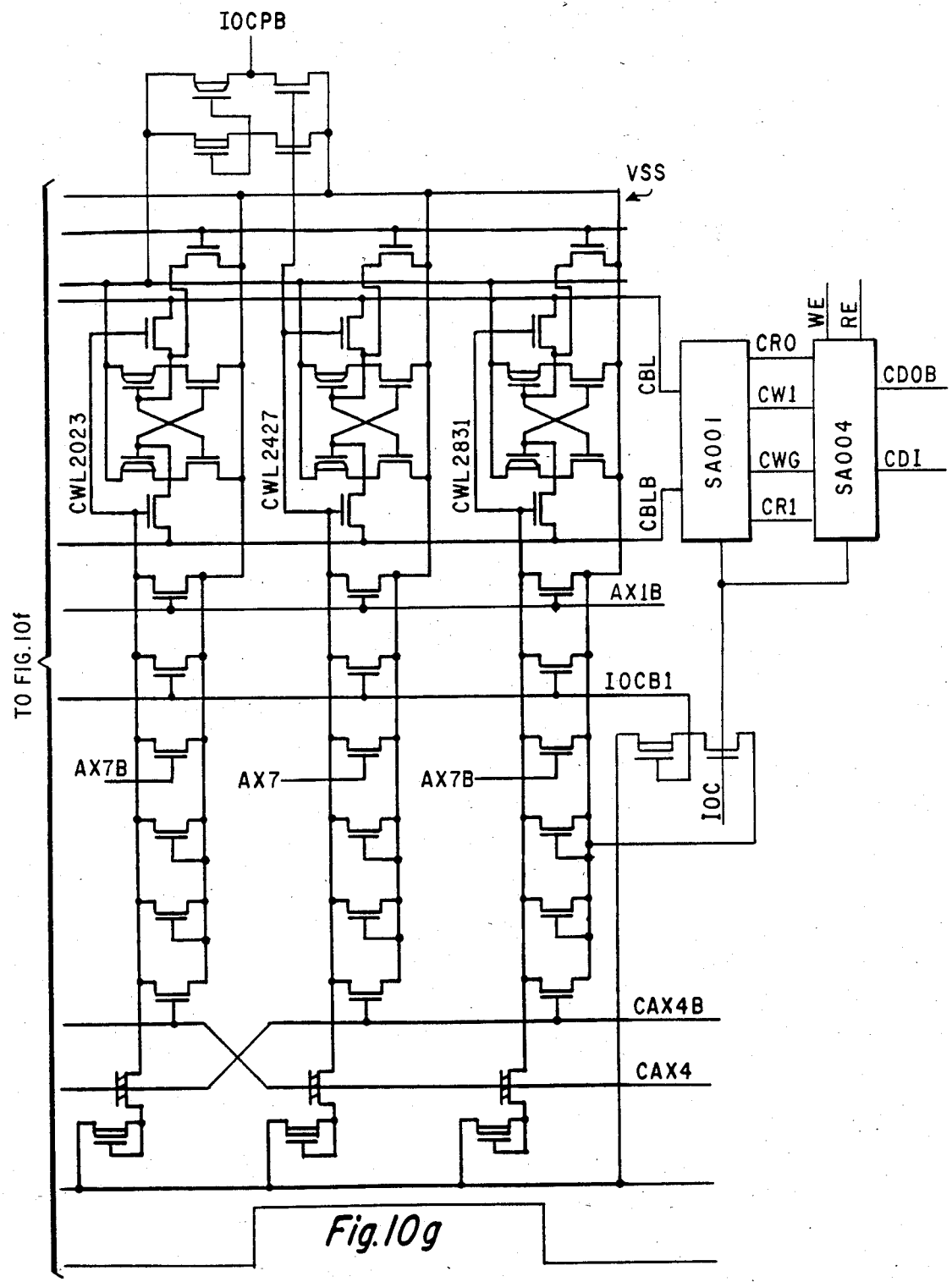
Figure 10H:
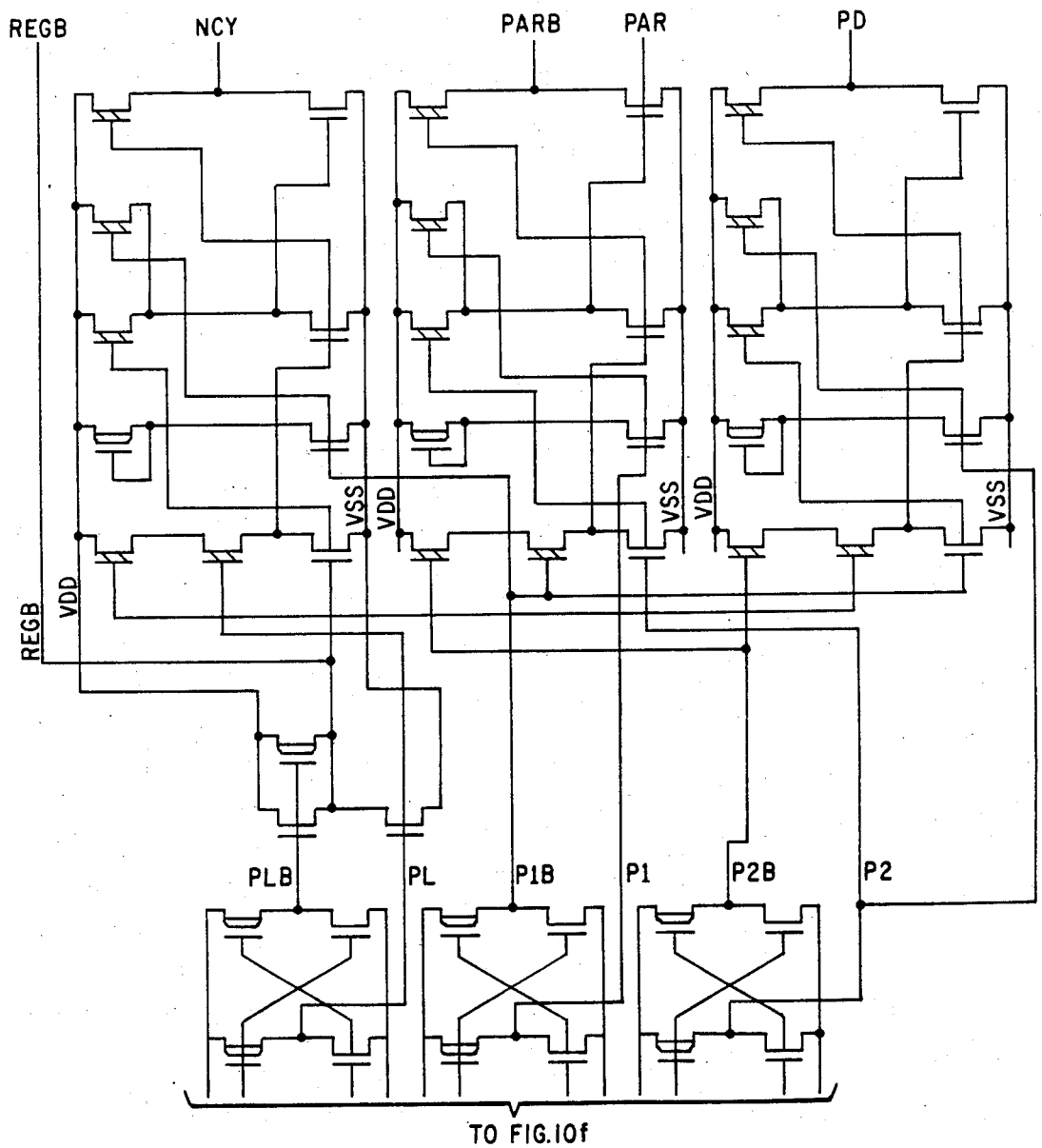
Figure 10I:
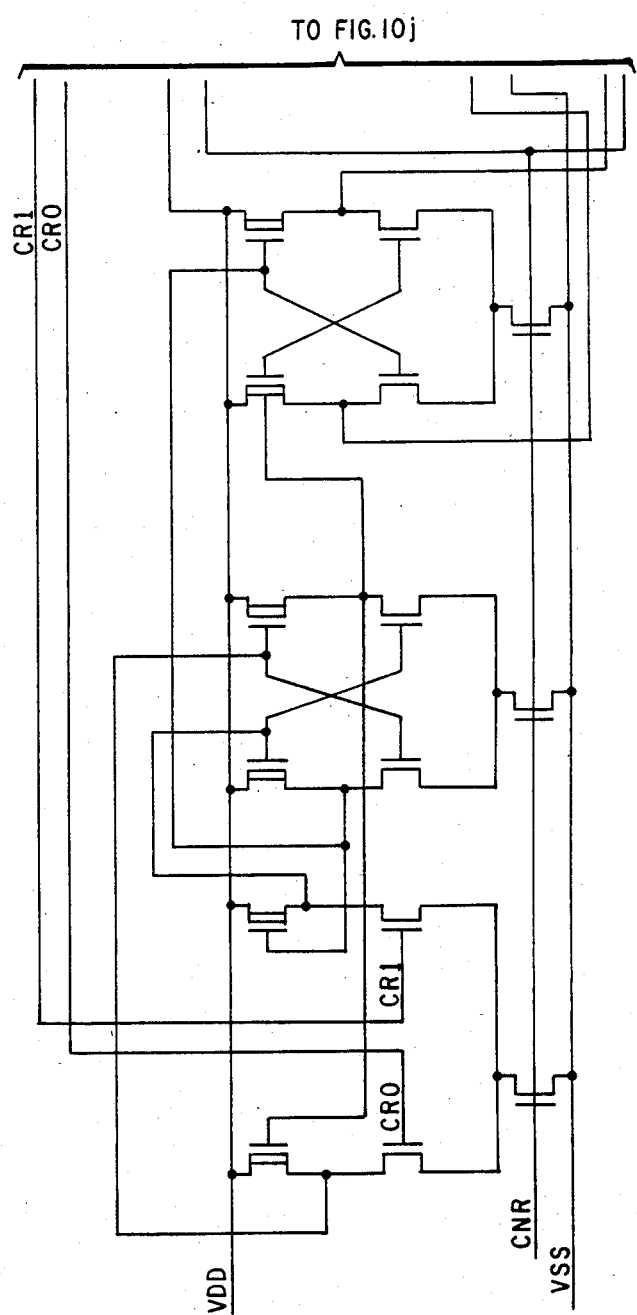
Figure 10J:
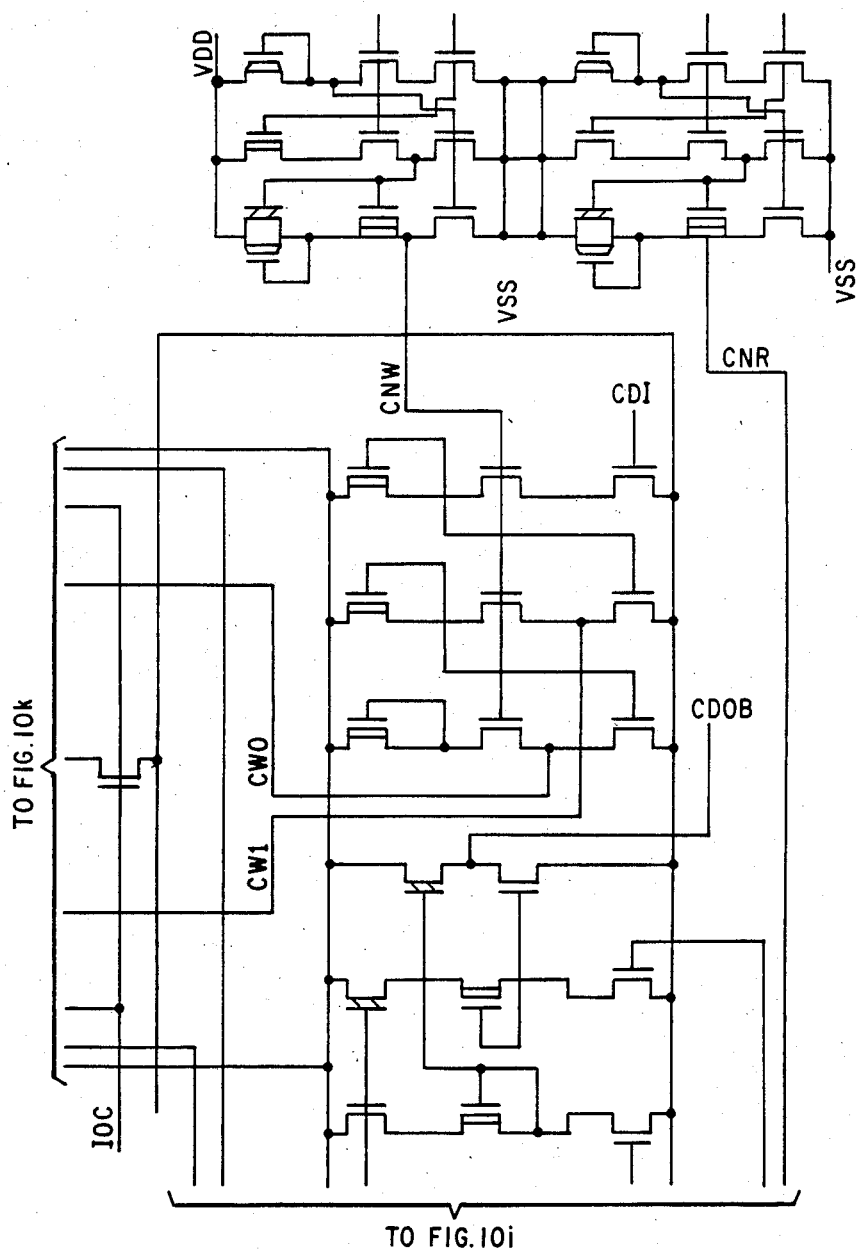
Figure 10K:
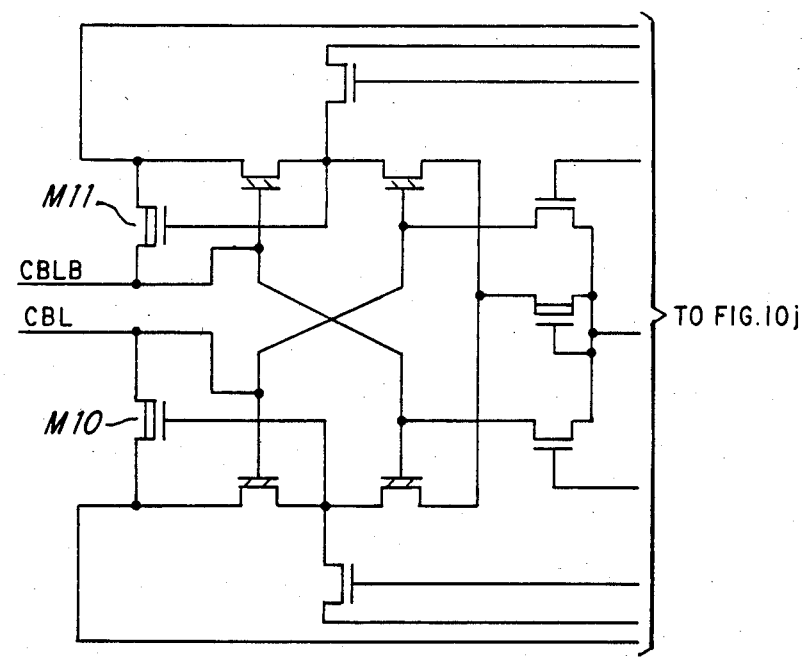

FIG. 9 shows a block diagram of the connections of the configuration RAM within the memory chip. Three bits CT0, CT1 and CT1 are received from pins to indicate the cycle type as discussed above (i.e. CPU access, DMA access, or overhead operation, such as reading or writing into the configuration RAM.)

The configuration decoder is connected to receive the five most significant row address bits A8 through A4, and also receives three decoded cycle-type lines from the cycle-type decoder.

The configuration RAM decoder is specially designed to function differently in the two configuration RAM modes. In the I/O mode, the decoder uses the 5 address inputs to individually select any one of the 23 memory cells in the configuration RAM for read/write operations into that cell. In the memory mode, one of the configuration cells which stores write protect information is selected by a subset of the address lines (preferably the 3 most significant row address bits) and the cycle type control lines of the main memory for the purpose of providing dynamic write protect control information to the chip as the address and control inputs to the main memory are varied. This feature is used to provide a write protection or inhibit function for main memory write operations, depending on which of 8 designated blocks of main memory is addressed and whether the configuration RAM cell associated with write protect of that block is set to a 1 state. The configuration RAM decoder uses 3 address inputs and cycle type control information from the main memory to decode information from two groups of eight configuration cells, each corresponding to 1 of the 8 defined blocks of main RAM memory. Since the same address lines are utilized by the configuration RAM decoder and the main RAM decoder, synchronization of configuration RAM control signals and main memory operations is provided.

In addition, the configuration RAM decoder also provides control of the redundancy fuse read/write operation. During a control mode, a designated address input combination will enable the decoder output signal IOCPB, which powers up a fuse read/write cycle. In this case, the column address lines A9-A12 (i.e. AY-0-AY3) are routed through a redundancy address decoder for programmation and/or readout of the fuses which encode the location of a defective column which is to be replaced by the redundant columns provided in the array.

The actual circuit of the presently preferred embodiment is shown in FIG. 10.

FIG. 10 shows a sample implementation of the buffer FIG. 9, with device dimensions given (in the format width/length). This layout shows a realization of the present invention in NMOS logic, using a 3-volt supply voltage VDD. The devices shown with two diagonal lines under their gates are natural transistors, having a threshold voltage of around 0.2 volts, the devices shown with a line underneath the channel and square corners on the channel are depletion mode devices, having a threshold voltage in the neighborhood of $-1.2$ volts. The devices which are shown with a line underneath the channel, and which have angled corners shown at the channel ends in the drawings (such as, for example, the cell loads used in each of the memory cells) are weak depletion devices, which have a threshold voltage in the neighborhood of $-0.6$ volts. The other devices are enhancement-mode, and have a threshold voltage of about 0.5 volt.

The 16 configuration RAM memory cells which are accessed by the decoded nodes CWL0 through CWL15 control write protection. Eight of these cells are accessed by a signal derived from the signal CPU, which indicates that a CPU read or write operations is proceeding, and eight of these are accessed by a signal derived from the DMA signal. These complementary signals, together with the most significant row address bits AX5 (A0), AX6 (i.e. A1), and AX7 (i.e. A2) are decoded to access one of these 16 cells if the bit OVRD is low. Each memory cell comprises a cross-coupled pair of inverters, which provides a full digital output to the gate of an output transistor M2. Note that, for these 16 cells in the configuration RAM only, the output transistor M2 is connected in series with a multiplexing transistor M1, which is controlled by the cell access lines CWL0 through CWL15. That is, when operating in the memory mode, each cell will hold its transistor M2 open or closed, and, as the row address bits are compared, only one of the 16 transistors CWL will have a high access signal CWL during a write operation, and this accessed memory cell will then turn on its multiplexed transistor M1 so that transistor M2, if it is on, can pull down the aligned CPU PRB or DMA PRB.

Note that the cells accessed by signals accessed by signals CWL16 through CWL18 simply provide digital output signals to an output amplifier and then through a buffer stage to drive control buses which control the various programmable peripherals. These outputs are continuous, regardless of whether these access lines CWL16 through CWL18 have been raised or not.

Each cell also contains a reset transistor M3, which, if the RST line is raised, will asynchronously pull all of the cells in the configuration RAM into the "zero" state. As discussed above, this provides convenient initialization of the control functions of the memory.

Each cell also contains pass transistors M4 and M5, which, if the appropriate CWL line goes high, connects the output nodes of the memory cell to the bit lines, CBL and $\overline{CBL}$. These bit lines are connected to a sense amplifier and buffer stages, to provide a data bus output when the CNR signal indicates a configuration RAM read cycle. Similarly, when the CNW signal indicates a configuration RAM write cycle, the data bus input line CDI is buffered and drives the sense amplifier, which drives the bit lines CBL and $\overline{CBL}$ to write information into the access cell.

While, as discussed above, the cell access transistors M4 and M5 need to limit the voltage swing on the bit lines, and therefore should not have an excessively high conductance, the driver devices M7 and My and/or the load devices M8 and M9 in each cell will have to be increased in width over the conventional dimensions if the demands of subsequent logic stages are large. Thus, it is preferable that, as shown, the digital outputs from the cell nodes be immediately buffered and not be used to drive long bus lines. That is, if the drivers M6 and M7 and/or the load devices M8 and M9 are made excessively large, the write operation will become slow or impossible, unless the past transistors M4 and M5 are widened and/or shortened to increase their on-state conductance. However, if this is done, the signal on the bit lines will increase, which is undesirable as discussed above. One way to provide higher logic drive capabilities from the cell, without incurring disturb problems, is to increase the conductance of transistors M4 and M5, and also increase the conductance of the bit line load transistors M10 and M11. In this case, a higher current will flow through the access transistors during the read operation, but this higher current will be balanced by higher current through the bit line load transistors M10 or M11. This means higher power dissipation during each write cycle which is undesirable. However, note that the sense amplifier used in the presently preferred embodiment uses positive feedback to control the bit line load transistors M10 and M11; this reduces the total power dissipation during the write operation.

The continuous-read memory cells used in the present invention are shown in FIGS. 11 and 13.

The memory cell is a NMOS depletion-load type cell which stores data on the output nodes of two cross-coupled inverters. Conventional transfer gates connect the cell to a bit line pair to provide read/write operations on the single cell selected by a high signal on the transfer gates (word-line node). The bit lines interface the memory cell to a sense amplifier and output buffer combination to transmit data to and from the I/O pin of the chip. A unique feature of this RAM cell is the connection of the cell internal signal nodes (inverter outputs) to logic gates to provide utilization of the stored data in the cell without relying on the standard bit line and sense amplifier signal path. For the pipeline and parity control bits, the memory cell has differential outputs, that is both cell nodes are fed to external push-pull buffers to drive the pipeline and parity control lines in a continuous fashion, switching only when the corresponding memory cell data is altered. For the write protection bits, only one node of the cell is brought out to a NAND logic gate where the decoder output for that cell is also used to provide dynamic write protection control information that depends on both the stored information in the configuration memory bits and the address information to the memory chip. Both types of cells require that the transconductance ratio of driver devices to transfer gates be sufficiently large to avoid deterioration of the high and low voltage levels of the cell nodes A and B during the time when the word line is high and the transfer gates are on, connecting the cell nodes A and B to the sense amplifier via the bit lines. The high and low voltage levels of the cell nodes A and B have stricter requirements imposed by direct connection of logic gates to A and B, compared with the standard data path to the bit lines and sense amp which is differential and more tolerant of reduced signal amplitudes.

Compared to the standard memory cell the transfer gates are lengthened and the driver devices are widened to provide a higher current gain ratio. The conductance of the load devices is also increased to compensate for the added capacitance load of the logic connected to A and B. Another feature of the configuration memory cell is a reset transistor that forces the cell to a "0" state asynchronously whenever the reset signal is active.

As will be apparent to those skilled in the art, the present invention can be embodied in a wide range of modification and variations, and is therefore not limited except as specified in the accompanying claims.

What is claimed is:

1. An integrated circuit memory comprising:
   (a) an array of memory cells;
   (b) output means for reading out one or more selected cells from said array of memory cells;
   (c) programmable peripheral circuits, said programmable peripheral circuits comprising means for controlling the operation of said output means to effect a predetermined memory control logic function; and
   (d) a configuration RAM connected to at least one of said programmable peripheral circuits for controlling the operations thereof;
   (e) said configuration RAM comprising both constant-value output means connected to selected ones of said programmable peripheral circuits and differential analog output means.

2. The memory of claim 1, wherein said configuration RAM comprises:
   a column of continuous read memory cells, each said continuous-memory cell comprising:
   a cross-coupled latch,
   first and second output means connected to said cross-coupled latch, and a transfer-gate gating said first output connection.

3. The memory of claim 2, wherein each said cross-coupled latch comprises two driver transistors, and said driver transistors and said transfer gates all comprise insulated-gate field-effects transistors,
   and wherein the width to length ratio of said gate is at least four times the width-to-length ratio of said transfer gate.

4. The memory of claim 1, wherein said configuration RAM comprises a plurality of memory cells, each said memory cell providing both digital and analog outputs.

5. The memory of claim 4, wherein a plurality of said configuration RAM memory cells each comprise a decoder for selectively accessing one of said memory cells.

6. The memory of claim 5, wherein a plurality of said configuration memory cells encodes write protection information, said write protection cells each having the decoder thereof connected to decode a plurality of most significant address bits from among said plural address bits defining a cell in said memory array.

7. The memory of claim 6, wherein said write protection memory cells each comprises a multiplex transistor connected in series with said digital output thereof, said multiplex transistor being controlled by the output of said decoder of said respective write protection memory cell.

* * * * *